(12) United States Patent
Kohno et al.

(10) Patent No.: US 7,534,820 B2
(45) Date of Patent: *May 19, 2009

(54) PHOTOCURING RESIN COMPOSITION CONTAINING ORGANIC POLYMER HAVING EPOXY GROUP AND/OR OXETANE GROUP-CONTAINING SILICON GROUP AT END, AND METHOD FOR PRODUCING SAME

(75) Inventors: Yoshiyuki Kohno, Akashi (JP); Hiroshi Ando, Akashi (JP)

(73) Assignee: Kaneka Corporation, Osaka (JP)

( * ) Notice: Subject to any disclaimer, the term of this patent is extended or adjusted under 35 U.S.C. 154(b) by 348 days.

This patent is subject to a terminal disclaimer.

(21) Appl. No.: 11/373,306

(22) Filed: Mar. 13, 2006

(65) Prior Publication Data

US 2007/0066699 A1    Mar. 22, 2007

Related U.S. Application Data

(63) Continuation-in-part of application No. PCT/JP2004/013707, filed on Sep. 13, 2004.

(30) Foreign Application Priority Data

Sep. 18, 2003 (JP) .............................. 2003-326713

(51) Int. Cl.
- *C08G 77/14* (2006.01)
- *C08L 23/22* (2006.01)
- *C08L 71/02* (2006.01)
- *C08L 83/06* (2006.01)

(52) U.S. Cl. ............................ 522/31; 522/66; 522/148; 528/13; 528/14; 528/15; 528/16; 528/17; 528/29; 528/40

(58) Field of Classification Search ................ 522/148, 522/31, 66; 528/25, 40, 13–18, 29
See application file for complete search history.

(56) References Cited

U.S. PATENT DOCUMENTS 4,954,580 A * 9/1990 Zahir ......................... 525/476
5,260,455 A * 11/1993 Eckberg ..................... 549/215
5,266,644 A * 11/1993 Riffle et al. ................. 525/286
5,696,179 A * 12/1997 Chawla ....................... 522/90
5,939,477 A * 8/1999 Pretzer et al. ............... 524/261
6,218,445 B1 * 4/2001 Priou et al. ................... 522/25
6,218,482 B1 * 4/2001 Yamanaka et al. .......... 525/524
6,506,868 B1   1/2003 Goda et al.
6,706,779 B2 * 3/2004 Bahadur et al. .............. 522/99
6,733,893 B2 * 5/2004 Suzuki et al. ............... 428/447
6,747,071 B1 * 6/2004 Frances ...................... 522/148
6,831,133 B2 * 12/2004 Kennedy et al. ............ 525/313
7,034,089 B2 * 4/2006 Herr et al. .................... 525/479
7,067,605 B2 * 6/2006 Kohno et al. .................. 528/27
7,081,494 B2 * 7/2006 Fujita et al. ................. 524/543
7,176,269 B2 * 2/2007 Hakuta et al. ................. 528/34
2003/0232900 A1  12/2003 Irifune
2006/0111536 A1   5/2006 Kohno et al.

FOREIGN PATENT DOCUMENTS

| JP | 5-214021 A1 | 8/1993 |
|---|---|---|
| JP | 6-135973 A1 | 5/1994 |
| JP | 2001-40066 A1 | 2/2001 |
| JP | 2001-114897 A1 | 4/2001 |
| JP | 2002-526391 A1 | 8/2002 |
| JP | 2004-68000 A1 | 3/2004 |
| JP | 2004-143200 A1 | 5/2004 |

* cited by examiner

*Primary Examiner*—Susan W Berman
(74) *Attorney, Agent, or Firm*—Sughrue Mion, PLLC

(57) ABSTRACT

The present invention provides a novel photocurable composition containing an organic polymer having an epoxy group and/or oxetane group-containing silicon group at an end and a cationic photoinitiator. For example, the photocurable composition contains an organic polymer (A) having an epoxy group and/or oxetane group-containing silicon group at an end, and a cationic photoinitiator (B), the organic polymer (A) being produced by addition reaction between an organic polymer terminated with an unsaturated group and a hydrosilane compound having an epoxy group and/or an oxetane group.

12 Claims, No Drawings

PHOTOCURING RESIN COMPOSITION CONTAINING ORGANIC POLYMER HAVING EPOXY GROUP AND/OR OXETANE GROUP-CONTAINING SILICON GROUP AT END, AND METHOD FOR PRODUCING SAME

This application is a continuation-in-part of International Application No. PCT/JP2004/013707 filed on Sep. 13, 2004, claiming priority based on Japanese Application No. 2003-326713 filed on Sep. 18, 2003, the contents of all of which are incorporated herein by reference on their entirety to the extent the contents are not inconsistent herewith.

TECHNICAL FIELD

The present invention relates to a novel photocurable composition containing a cationic photoinitiator and any one of various organic polymers each having an epoxy group and/or oxetane group-containing silicon group at an end, the organic polymers being each prepared by selectively introducing an epoxy group and/or oxetane group-containing silicon group at an end.

BACKGROUND ART

Epoxy group-containing polymers prepared by introducing epoxy groups into various polymers have been developed because of the satisfactory reactivity and adhesiveness of epoxy groups. However, in introducing an epoxy group, a method for epoxidizing an olefin with a peroxide or the like disadvantageously causes the degradation of a polymer due to oxidation or the like and have difficulty in selectively introducing an epoxy group into an end of a polymer and in polyfunctionalizing a polymer. Furthermore, some production methods require the removal of a by-product. As the above-described method, particularly, a method for preparing an epoxy group-containing polyisobutene by polymerization has the problem of oxidation degradation. Furthermore, the structure of an epoxy group-containing polymer prepared by the method has the problem of reactivity due to steric hindrance at the periphery of the epoxy group (Japanese Unexamined Patent Application Publication No. 3-56505). Therefore, such epoxy group-containing polymers prepared by the known method do not always exhibit physical properties satisfactory for various applications.

On the other hand, various organic polymers have been widely known to have unique features. In particular, saturated hydrocarbon polymers whose main-chain skeletons are each composed of one material selected from the group consisting of polyisobutylenes, hydrogenated polyisoprenes, hydrogenated polybutadienes, and copolymers thereof have features, such as high weather resistance, high heat resistance, low moisture permeability, low gas permeability, and satisfactory flexibility. On the other hand, oxyalkylene polymers have excellent compatibility with other polymers, flexibility, and low-temperatures characteristics.

There have also been developed various polymers each prepared by introducing a hydrolyzable group, an unsaturated group, a hydrosilyl group, or the like into an end of the saturated hydrocarbon polymer, the oxyalkylene polymer, or the like. To cure these polymers, moisture and heating are required. Furthermore, a certain amount of time and a high-temperature condition are required until these polymers are sufficiently cured. Additionally, these polymers are disadvantageous in view of storage stability. In particular, in applications to bonding and sealing in the peripheries of electronic components, it has recently been required to change a conventional thermocuring system to a photocuring system, for reducing a process time, and use a photocuring system for sealing agents for heat-sensitive components, such as organic electroluminescent components. Epoxy group-containing polymers are used in new applications, such as cationic photocuring and the like, and are expected to be used in the field of such electronic materials.

As described above, polymers each prepared by selectively introducing an epoxy group into an end of an organic polymer have been highly demanded. Furthermore, these polymers are highly required for application to photocuring capable of reducing a curing time.

DISCLOSURE OF THE INVENTION

The present invention relates to a novel photocurable composition containing a cationic photoinitiator and any one of various organic polymers each having an epoxy group and/or oxetane group-containing silicon group at an end, the organic polymers being each prepared by selectively introducing an epoxy group and/or oxetane group-containing silicon group at an end. The inventive composition does not require, for example, a high-temperature condition, a moisture condition, and the like which provide burdens on a base material, and can be satisfactorily cured by light energy irradiation within a short time.

To overcome the above-described problems, the present inventors have conducted intensive studies and found that a polymer including a specific epoxy group-containing silicon group has satisfactory physical properties. This finding resulted in completion of the present invention.

Namely, the present invention relates to the following:

1) A photocurable composition containing an organic polymer (A) having a structure represented by formula (1), (2), or (3) at an end, and a cationic photoinitiator (B).

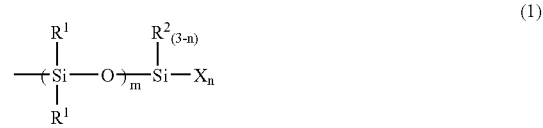
(1)

(wherein $R^1$ and $R^2$ are the same or different and each represent an alkyl group having 1 to 20 carbon atoms, an aryl group having 6 to 20 carbon atoms, an aralkyl group having 7 to 20 carbon atoms, or a triorganosiloxy group represented by (R')$_3$SiO— wherein three R's are each a monovalent hydrocarbon group having 1 to 20 carbon atoms and may be the same or different, and when two or more $R^1$ or $R^2$ are present, they may be the same or different; X represents a monovalent organic group containing an epoxy group and/or an oxetane group; m represents an integer of 0 to 20; and n represents an integer of 1, 2, or 3.)

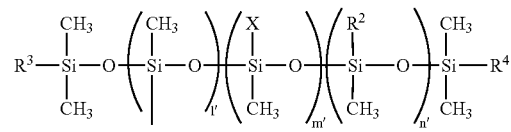
(2)

(wherein X and $R^2$ are the same as the above, $R^3$ and $R^4$ each represent a methyl group or the same as X or $R^2$, or either $R^3$ or $R^4$ is a bond part to the organic polymer; l' is 1 on average and represents the number of a bond part to an end of the organic polymer, and when either $R^3$ or $R^4$ is a bond part to the organic polymer, l' is 0; $1 \leq m'+n' \leq 50$, $1 \leq m'$, and $0 \leq n'$; and the position of each of the units is not specified, and when two or more each of the units are present, the units may be alternately or randomly positioned.)

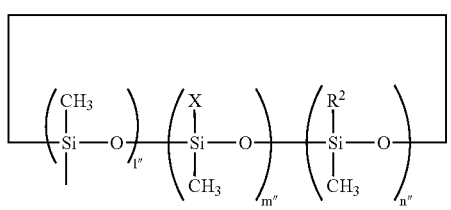

(3)

(wherein X and $R^2$ are the same as the above; l'' is 1 on average and represents the number of a bond part to an end of the organic polymer; $1 \leq m''+n'' \leq 20$, $1 \leq m''$, and $0 \leq n''$; and the position of each of the units is not specified, and when two or more each of the units are present, the units may be alternately or randomly positioned.)

2) The photocurable composition described in 1), wherein X of the organic polymer (A) has a structure represented by formula (4):

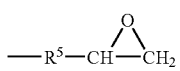

(4)

(wherein $R^5$ represents a divalent organic group having 1 to 20 carbon atoms and containing at least one selected from the group consisting of hydrogen, oxygen, and nitrogen as a constituent atom.)

3) The photocurable composition described in 1), wherein X of the organic polymer (A) has a structure represented by formula (5):

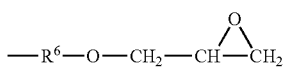

(5)

(wherein $R^6$ represents a divalent organic group having 1 to 20 carbon atoms and containing at least one selected from the group consisting of hydrogen, oxygen, and nitrogen as a constituent atom.)

4) The photocurable composition described in 1), wherein X of the organic polymer (A) has a structure represented by formula (6):

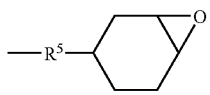

(6)

(wherein $R^5$ is the same as the above.)

5) The photocurable composition described in any one of 1) to 4), wherein the main chain skeleton of the organic polymer (A) is selected from saturated hydrocarbon polymers, oxyalkylene polymers, and vinyl polymers.

6) The photocurable composition described in 5), wherein the saturated hydrocarbon polymer is selected from the group consisting of polyisobutylenes, hydrogenated polybutadienes, hydrogenated polyisoprenes, and copolymers thereof.

7) The photocurable composition described in any one of 1) to 6), wherein the organic polymer (A) is produced by reaction between an organic polymer terminated with an unsaturated group and a hydrosilane compound, and the hydrosilane compound contains an epoxy group and/or an oxetane group.

8) The photocurable composition described in any one of 1) to 6), wherein the organic polymer (A) is produced by hydrolyzable group exchange reaction between an organic polymer terminated with a hydrolyzable silyl group and a compound having one hydroxyl group per molecule, and the compound having one hydroxyl group per molecule contains at least one epoxy group and/or oxetane group.

9) The photocurable composition described in any one of 1) to 8), wherein the cationic photoinitiator (B) has a structure represented by formula (7):

(7)

(wherein W represents S, Se, Te, P, As, Sb, Bi, O, I, Br, Cl, Ti, Zr, Fe, Ru, Os, or N≡N; and $R^7$, $R^8$, $R^9$, and $R^{10}$ are the same or different and each represent an organic group; a, b, c, and d each represent an integer of 0 to 3, and (a+b+c+d) equals to the valence of W; M represents a metal or matalloid constituting a center atom of a complex $[MZ_{v+u}]$ and being selected from B, P, As, Sb, Fe, Sn, Bi, Al, Ca, In, Ti, Zn, Sc, V, Cr, Mn, and Co; Z represents a halogen atom or an organic group which is a ligand coordinating to M; u represents the net electric charge of the complex ion; and v represents the valence of M.)

10) The photocurable composition described in any one of 1) to 8), wherein the cationic photoinitiator (B) is selected from onium salts, diaryliodonium salts of sulfonic acid, triarylsulfonium salts of sulfonic acid, diaryliodonium salts of boronic acid, and triarylsulfonium salts of boronic acid.

11) The photocurable composition described in any one of 1) to 10), the composition further containing at least one selected from epoxy group-containing compounds and/or epoxy group-containing oligomers (C) and oxetane group-containing compounds and/or oxetane group-containing oligomers (D).

12) A method for producing a cured product, wherein the photocurable composition described in any one of 1) to 11) is irradiated with a light energy source to obtain a cured product.

13) A cured product obtained by the method described in 12).

14) A product containing the cured product described in 13) as a component.

The present invention relates to a novel photocurable composition containing a cationic photoinitiator and an organic polymer having an epoxy group and/or epoxy group-containing silicon group at an end, and the photocurable composition can exhibit excellent curability by irradiation of a light energy source within a short time. The photocurable composition is very useful in industrial applications, such as a coating agent, an adhesive, a sealant, and the like.

BEST MODE FOR CARRYING OUT THE INVENTION

A photocurable composition of the present invention is a novel composition containing an organic polymer (A) having an epoxy group and/or epoxy group-containing silicon group at an end and a cationic photoinitiator (B). In some cases, the photocurable composition further contains an epoxy group-containing compound and/or an epoxy group-containing oligomer (C) and an oxetane group-containing compound and/or an oxetane group-containing oligomer (D). According to demand, the photocurable composition may further contain other components, such as another cationically photopolymerizable compound, a silane coupling agent, a filler, a modifier, a stabilizer, another resin component, and the like, within a range in which the effect of the invention is not impaired.

The photocurable composition of the present invention has excellent curability and exhibits the characteristics peculiar to the polymer thereof depending on the type of the organic polymer main chain serving as the skeleton thereof. The main chain skeleton of the organic polymer is not particularly limited, and, for example, a generally known organic polymer such as an acrylic polymer, a polyester polymer, a saturated hydrocarbon polymer, an oxyalkylene polymer, or the like, can be used.

In the present invention, the structure of at least one end of the organic polymer (A) is represented by formula (1), (2), or (3):

(1)

wherein $R^1$ and $R^2$ are the same or different and each represent an alkyl group having 1 to 20 carbon atoms, an aryl group having 6 to 20 carbon atoms, an aralkyl group having 7 to 20 carbon atoms, or a triorganosiloxy group represented by $(R')_3SiO-$ wherein three R's are each a monovalent hydrocarbon group having 1 to 20 carbon atoms and may be the same or different, and when two or more $R^1$s or $R^2$s are present, they may be the same or different; X represents a monovalent organic group containing an epoxy group and/or an oxetane group; m represents an integer of 0 to 20; and n represents an integer of 1, 2, or 3.

In formula (1), m is preferably 0 to 10 from the viewpoint of availability of raw materials.

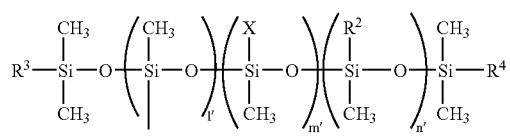
(2)

wherein X represents a monovalent organic group containing an epoxy group, $R^2$ represents a hydrocarbon group having 1 to 20 carbon atoms which may contain at least one phenyl group, $R^3$ and $R^4$ each represent a methyl group or the same as X or $R^2$, or either $R^3$ or $R^4$ is a bond part to the organic polymer; l' is 1 on average and represents a bond part to an end of the organic polymer, and when either $R^3$ or $R^4$ is a bond part to an end of the organic polymer, l' is 0; $1 \leq m'+n' \leq 50$, $1 \leq m'$, and $0 \leq n'$; and the position of each of the units is not specified, and when two or more each of the units are present, the units may be alternately or randomly positioned.

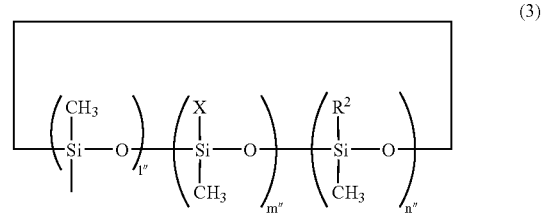
(3)

wherein X and $R^2$ are the same as the above; l" is 1 on average and represents a bond part to an end of the organic polymer; $1 \leq m''+n'' \leq 20$, $1 \leq m''$, and $0 \leq n''$; and the position of each of the units is not specified, and when two or more each of the units are present, the units may be alternately or randomly positioned.

In formula (2), m'+n' is 1 to 50, preferably 3 to 30, and particularly preferably 4 to 20 from the viewpoint of compatibility between the polymer and a hydrosilane compound, and reactivity of the photocurable composition containing the resultant organic polymer having an epoxy group and/or an oxetane group.

In addition, m' is 1 or more, and the reactivity of the organic polymer (A) can be controlled by m'. From the viewpoint of reactivity of the resulting organic polymer having an epoxy group and/or an oxetane group, m' is preferably 2 or more.

Furthermore, n' is 0 or more, and compatibility between the organic polymer and the hydrosilane compound can be controlled by n'. In particular, when the main chain skeleton of the organic polymer (A) is a saturated hydrocarbon organic polymer, n' is preferably 1 or more. When m' is 2 or more, n' is also preferably 2 or more. With the main chain skeleton having high polarity, such as an oxyalkylene polymer, n' is preferably 1.

In formula (3), m"+n" is 1 to 20 and preferably 3 to 20 from the viewpoint of an increase in the number of epoxy groups at ends of the polymer and the compatibility between the polymer and the hydrosilane compound.

In addition, m" is 1 or more, and the reactivity of the organic polymer (A) can be controlled by m". From the viewpoint of reactivity of the resulting organic polymer having an epoxy group and/or an oxetane group, m" is preferably 2 or more.

Furthermore, n" is 0 or more, and compatibility between the organic polymer and the hydrosilane compound can be controlled by n". In particular, when the main chain skeleton of the organic polymer (A) is a saturated hydrocarbon organic polymer, n" is preferably 1 or more. With the main chain skeleton having high polarity, such as an oxyalkylene polymer, n" is preferably 1.

In the terminal structure of the organic polymer of the present invention, X preferably has a structure represented by formula (4) from the viewpoint of reactivity of an epoxy group, and more preferably a structure represented by formula (5) from the viewpoint of easy production and availability of raw materials.

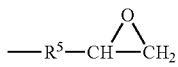
(4)

wherein $R^5$ represents a divalent organic group having 1 to 20 carbon atoms and containing at least one selected from the group consisting of hydrogen, oxygen, and nitrogen as a constituent atom.

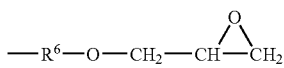
(5)

wherein $R^6$ represents a divalent organic group having 1 to 20 carbon atoms and containing at least one selected from the group consisting of hydrogen, oxygen, and nitrogen as a constituent atom.

From the viewpoint of curability, the structure is preferably represented by formula (6):

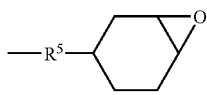
(6)

wherein $R^5$ is the same as the above.

In the present invention, the main chain skeleton of the organic polymer is not particularly limited. When the main chain skeleton is a saturated hydrocarbon polymer selected from the group consisting of polyisobutylene, hydrogenated polyisoprene, hydrogenated polybutadiene, and copolymers thereof, or an oxyalkylene polymer, the resulting cured product has a characteristic indicating rubber-like elasticity.

The saturated hydrocarbon polymer contains substantially no carbon-carbon unsaturated bond other than an aromatic ring. Examples of the saturated hydrocarbon polymer include polyethylene, polypropylene, polyisobutylene, hydrogenated polybutadiene, and hydrogenated polyisoprene.

The polymer constituting the main chain skeleton of the saturated hydrocarbon polymer used in the present invention can be produced by the following method: (1) An olefin compound having 1 to 6 carbon atoms, such as ethylene, propylene, 1-butene, or isobutylene, used as a main component is homopolymerized or copolymerized; or (2) a diene compound such as butadiene or isoprene is homopolymerized or copolymerized, or copolymerized with the above-described olefin compound and then hydrogenated. In particular, an isobutylene polymer and a hydrogenated polybutadiene polymer are preferred because a functional group can be easily introduced into an end, the molecular weight can be easily controlled, and the number of terminal functional groups can be increased. Among these, an isobutylene polymer is particularly preferred because it is liquid or fluid and thus easy to handle, it has no carbon-carbon unsaturated bond other than an aromatic ring in its main chain and thus need not be hydrogenated, and it has excellent weather resistance.

The isobutylene polymer may include an isobutylene unit alone as a monomer unit or may include another monomer unit copolymerizable with isobutylene in a range of preferably 50% by weight or less, more preferably 30% by weight or less, and most preferably 10% by weight or less. In particular, a homopolymer is most preferred.

Examples of such a monomer unit include olefins having 4 to 12 carbon atoms, vinyl ethers, aromatic vinyl compounds, vinylsilanes, and allylsilanes. Specific examples of such a copolymer component include 1-butene, 2-butene, 2-methyl-1-butene, 3-methyl-1-butene, pentene, 4-methyl-1-pentene, hexene, vinylcyclohexene, methyl vinyl ether, ethyl vinyl ether, isobutyl vinyl ether, styrene, α-methylstyrene, dimethylstyrene, monochlorostyrene, dichlorostyrene, β-pinene, indene, vinyltrichlorosilane, vinylmethyldichlorosilane, vinyldimethylchlorosilane, vinyldimethylmethoxysilane, vinyltrimethylsilane, divinyldichlorosilane, divinyldimethoxysilane, divinyldimethylsilane, 1,3-divinyl-1,1,3,3-tetramethyldisiloxane, trivinylmethylsilane, tetravinylsilane, allyltrichlorosilane, allylmethyldichlorosilane, allyldimethylchlorosilane, allyldimethylmethoxysilane, allyltrimethylsilane, diallyldichlorosilane, diallyldimethoxysilane, diallyldimethylsilane, γ-methacryloyloxypropyl trimethoxysilane, and γ-methacryloyloxypropylmethyl dimethoxysilane.

Like the isobutylene polymer, a hydrogenated polybutadiene polymer or another saturated hydrocarbon polymer may contain another monomer unit in addition to a monomer unit as a main component.

The saturated hydrocarbon polymer, preferably the isobutylene polymer or hydrogenated polybutadiene polymer, preferably has a number-average molecular weight of about 500 to 50,000. In particular, the liquid or fluid saturated hydrocarbon polymer having a molecular weight of about 1,000 to 20,000 is preferred from the viewpoint of easy handling and the like.

The main chain structure of the oxyalkylene polymer may include a polymer having an —$R^{11}$—O— structure as a repeating unit. In this case, $R^{11}$ may be a divalent organic group having 1 to 20 carbon atoms. The polymer may be a homopolymer having the same repeating unit alone or a copolymer having two or more types of repeating units. The main chain may have a branched structure.

Specific examples of $R^{11}$ include —$CH_2CH_2$—, —$CH(CH_3)CH_2$—, —$CH(C_2H_5)CH_2$—, —$C(CH_3)_2CH_2$—, and —$CH_2CH_2CH_2CH_2$—. In particular, $R^{11}$ is preferably —$CH(CH_3)CH_2$—.

The main chain skeleton of the oxyalkylene polymer is produced by, for example, ring-opening polymerization of a monoepoxide in the presence of an initiator and a catalyst.

Examples of the initiator include dihydric alcohols and polyhydric alcohols, such as ethylene glycol, propylene glycol, butanediol, hexamethylene glycol, methallyl alcohol, bisphenol A, hydrogenated bisphenol A, neopentyl glycol, polybutadienediol, diethylene glycol, triethylene glycol, polyethylene glycol, polypropylene glycol, polypropylene triol, polypropylene tetraol, dipropylene glycol, glycerin, trimethylol methane, trimethylol propane, and pentaerythritol; and hydroxyl group-containing oligomers.

Specific examples of the monoepoxide include alkylene oxides, such as ethylene oxide, propylene oxide, α-butylene oxide, β-butylene oxide, hexene oxide, cyclohexene oxide, styrene oxide, and α-methylstyrene oxide; alkyl glycidyl ethers, such as methyl glycidyl ether, ethyl glycidyl ether, isopropyl glycidyl ether, and butyl glycidyl ether; allyl glycidyl ethers; and aryl glycidyl ethers.

Examples of a process for synthesizing the polyoxyalkylene polymer include, but are not limited to, a polymerization process using an alkali catalyst such as KOH; a polymerization process using a transition metal compound-porphyrin complex catalyst, such as a complex produced by reaction between an organic aluminum compound and porphyrin, as disclosed in, for example, Japanese Unexamined Patent Application Publication No. 61-215623; a polymerization process using a double metal cyanide complex catalyst, as disclosed in, for example, Japanese Examined Patent Application Publication Nos. 46-27250 and 59-15336; a polymerization process using a cesium catalyst; and a polymerization process using a phosphazene catalyst. In particular, the polymerization process using a double metal cyanide complex catalyst is preferred from the viewpoint that a polymer having a high molecular weight and less coloring can be easily obtained.

The main chain skeleton of the oxyalkylene polymer can be also produced by extending the chain of a hydroxyl group-terminated oxyalkylene polymer using a di- or higher-functional alkyl halide, e.g., $CH_2Cl_2$, $CH_2Br_2$, or the like, in the presence of a basic compound, e.g., KOH, NaOH, $KOCH_3$, $NaOCH_3$, or the like.

The main chain skeleton of the oxyalkylene polymer may further contain another component, such as an urethane bond component, in a range in which the characteristics of the oxyalkylene polymer are not significantly impaired.

Next, the main chain skeleton including a vinyl polymer will be described.

In the present invention, a vinyl monomer constituting the main chain of the vinyl polymer is not particularly limited, and various vinyl monomers may be used. Examples of the vinyl monomer include (meth)acrylic monomers, such as (meth)acrylic acid, methyl(meth)acrylate, ethyl (meth)acrylate, n-propyl(meth)acrylate, isopropyl (meth)acrylate, n-butyl(meth)acrylate, isobutyl (meth)acrylate, tert-butyl(meth)acrylate, n-pentyl (meth)acrylate, n-hexyl(meth)acrylate, cyclohexyl (meth)acrylate, n-heptyl(meth)acrylate, n-octyl (meth)acrylate, 2-ethylhexyl(meth)acrylate, nonyl (meth)acrylate, decyl(meth)acrylate, dodecyl(meth)acrylate, phenyl(meth)acrylate, toluyl(meth)acrylate, benzyl (meth)acrylate, 2-methoxyethyl(meth)acrylate, 3-methoxybutyl(meth)acrylate, 2-hydroxyethyl(meth)acrylate, 2-hydroxypropyl (meth)acrylate, stearyl(meth)acrylate, glycidyl(meth)acrylate, 2-aminoethyl(meth)acrylate, γ-(methacryloyloxypropyl)trimethoxysilane, ethylene oxide adducts of (meth)acrylic acid, trifluoromethylmethyl(meth)acrylate, 2-trifluoromethylethyl(meth)acrylate, 2-perfluoroethylethyl(meth)acrylate, 2-perfluoroethyl-2-perfluorobutylethyl(meth)acrylate, 2-perfluoroethyl(meth)acrylate, perfluoromethyl(meth)acrylate, diperfluoromethylmethyl (meth)acrylate, 2-perfluoromethyl-2-perfluoroethylmethyl (meth)acrylate, 2-perfluorohexylethyl(meth)acrylate, 2-perfluorodecylethyl(meth)acrylate, and 2-perfluorohexadecylethyl(meth)acrylate; aromatic vinyl monomers, such as styrene, vinyltoluene, α-methylstyrene, chlorostyrene, and styrenesulfonic acid and salts thereof; fluorine-containing vinyl monomers, such as perfluoroethylene, perfluoropropylene, and vinylidene fluoride; silicon-containing vinyl monomers, such as vinyltrimethoxysilane and vinyltriethoxysilane; maleic anhydride, maleic acid, and monoalkyl and dialkyl esters of maleic acid; fumaric acid and monoalkyl and dialkyl esters of fumaric acid; maleimide monomers, such as maleimide, methylmaleimide, ethylmaleimide, propylmaleimide, butylmaleimide, hexylmaleimide, octylmaleimide, dodecylmaleimide, stearylmaleimide, phenylmaleimide, and cyclohexylmaleimide; acrylonitrile monomers, such as acrylonitrile and methacrylonitrile; amido group-containing vinyl monomers, such as acrylamide and methacrylamide; vinyl esters, such as vinyl acetate, vinyl propionate, vinyl pivalate, vinyl benzoate, and vinyl cinnamate; alkenes, such as ethylene and propylene; conjugated dienes, such as butadiene and isoprene; vinyl chloride; vinylidene chloride; allyl chloride; and allyl alcohol. These monomers may be used alone or as a copolymer of two or more.

The main chain of the vinyl polymer is preferably produced by polymerizing 100 mol % of a monomer selected from the group consisting of (meth)acrylic monomers, acrylonitrile monomers, aromatic vinyl monomers, fluorine-containing vinyl monomers, and silicon-containing vinyl monomers, or mainly polymerizing at least one monomer of these monomers. The term "mainly" means that the content of the monomer is 50 mol % or more and preferably 70 mol % or more of the monomer units constituting the vinyl polymer. In particular, styrene monomers and (meth)acrylic acid monomers are preferred in view of the physical properties of the product and the like. Among these, acrylate monomers and methacrylate monomers are more preferred, acrylate monomers are particularly preferred, and butyl acrylate is further more preferred. In the present invention, such a preferred monomer may be copolymerized or block copolymerized with another monomer. In this case, the weight ratio of the preferred monomer is preferably 40% or more. The above expression "(meth)acrylic acid" represents acrylic acid and/or methacrylic acid.

In applications requiring rubber elasticity, nonrestrictively, the vinyl polymer preferably has a glass transition temperature of room temperature to a temperature lower than the operation temperature.

In the present invention, as a synthetic process for the vinyl polymer, a known process such as free radical polymerization, controlled radical polymerization, or the like can be preferably used. In particular, the controlled radical polymerization is preferred from the viewpoint of easy introduction of the terminal structure of the present invention. As the controlled radical polymerization, living radical polymerization is preferred, and atom transfer radical polymerization is more preferred.

In the atom transfer radical polymerization, an organic halide, particularly an organic halide having a carbon-halogen bond with high reactivity (e.g., a carbonyl compound having a halogen at the α-position, or a compound having a halogen at a benzyl position), a halogenated sulfonyl compound, or the like is used as an initiator.

In the atom transfer radical polymerization, the molecular weight distribution of the vinyl polymer of the present invention, i.e., the ratio (Mw/Mn) of the weight-average molecular weight (Mw) to the number-average molecular weight (Mn) measured by gel permeation chromatography, is not particularly limited, but is preferably less than 1.8, more preferably 1.7 or less, further preferably 1.6 or less, still more preferably 1.5 or less, particularly preferably 1.4 or less, and most preferably 1.3 or less. In the present invention, GPC measurement is generally performed using chloroform as a mobile phase and a polystyrene gel column, and the number-average molecular weight and the like can be determined in terms of polystyrene.

In the present invention, the number-average molecular weight of the vinyl polymer is not particularly limited, but the number-average molecular weight measured by gel permeation chromatography is preferably in a range of 500 to 1,000,000, more preferably 1,000 to 100,000, and more preferably 5,000 to 50,000.

In the free radical polymerization, any of the above-listed monomers can be used, and, for example, a solution polymerization process using radical reaction can be used. The polymerization is usually performed by reaction at 50° C. to 150° C. using the above-described monomers, a radical initiator, a chain transfer agent, etc.

Examples of the radical initiator include azo initiators, such as 2,2'-azobisisobutyronitrile, 2,2'-azobis(2-methylbutyronitrile), 4,4'-azobis(4-cyanovaleric) acid, 1,1'-azobis(1-cyclohexanecarbonitrile), azobisisobutyramidine hydrochloride, and 2,2'-azobis(2,4-dimethylvaleronitrile); and organic peroxide initiators, such as benzoyl peroxide and di-tert-butyl peroxide. Among these initiators, the azo initiators are preferred from the viewpoint of no influence of the solvent used in the polymerization, the low danger of explosion or the like, and the like.

Examples of the chain transfer agent include mercaptane compounds, such as n-dodecyl mercaptane, tert-dodecyl mercaptane, lauryl mercaptane, γ-mercaptopropyl trimethoxysilane, γ-mercaptopropylmethyl dimethoxysilane, γ-mercaptopropyl triethoxysilane, and γ-mercaptopropylmethyl diethoxysilane; and halogen-containing compounds.

The polymerization may be performed in a solvent. Preferred examples of the solvent include unreactive solvents, such as ethers, hydrocarbons, and esters. In the free radical polymerization, the number-average molecular weight is not particularly limited, but the number-average molecular weight measured by gel permeation chromatography is 500 to 100,000 from the viewpoint of easy handling, and more preferably 5,000 to 30,000 because the resultant cured product has high weather resistance and workability.

In the present invention, the process for introducing an epoxy group and/or oxetane group-containing silicon group having the structure of formula (1), (2), or (3) into an end of the organic polymer is not particularly limited. However, since there is no degradation due to oxidation or the like in the introduction and no need for purification such as deoxidation or the like after the introduction, the introduction is preferably performed by addition reaction of a hydrosilane compound having an epoxy group and/or an oxetane group to an unsaturated group, or hydrolyzable group exchange reaction between an organic polymer terminated with a hydrolyzable silyl group and a compound having at least one epoxy group and/or oxetane group and one hydroxyl group per molecule.

The introduction by addition reaction of the hydrosilane compound can be effected by any one of the following processes: (I) An organic polymer terminated with an unsaturated group is synthesized and then subjected to addition reaction of a hydrosilane compound containing one hydrosilyl group on average which has an epoxy group and/or an oxetane group. (II) An organic polymer is subjected to terminal addition reaction of a hydrosilane compound having two or more hydrosilyl groups in its molecule and then addition reaction of an epoxy compound having an unsaturated group such as an allyl group or the like with unreacted hydrosilyl groups.

In the former process (I), the hydrosilane compound has one hydrosilyl group on average, and thus the group can be easily selectively introduced in an end of the polymer, thereby suppressing an increase in the molecular weight of the polymer. In this case, the charging order of reaction materials and the like are not limited. However, in view of the heat generation of the reaction system, the viscosity of the organic polymer, and the like, preferably, the hydrosilane compound containing one hydrosilyl group on average which has an epoxy group and/or an oxetane group is added dropwise to a mixture of a hydrosilylation catalyst and the organic polymer terminated with an unsaturated group.

The molar ratio between the terminal unsaturated group of the organic polymer and the hydrosilyl group is not particularly limited, but the molar ratio may be in a range of $0.5 \leq$ hydrosilyl group/terminal unsaturated group of organic polymer $\leq 2.0$. The molar ratio is preferably $0.8 \leq$ hydrosilyl group/terminal unsaturated group of organic polymer $\leq 1.5$ from the viewpoint of an increase in the introduction rate of an epoxy group and/or an oxetane group, and more preferably $0.8 \leq$ hydrosilyl group/terminal unsaturated group of organic polymer $\leq 1.2$ from the viewpoint of removal of the residual hydrosilane compound.

In the latter process (II), the compound having an epoxy group and/or an oxetane group can be sufficiently reacted with the unreacted hydrosilyl groups at the ends of the polymer, and thus a plurality of epoxy groups and/or oxetane groups can be introduced at the ends of the polymer. In this case, the charging order of reaction materials and the like are not limited. However, from the viewpoint of suppressing an increase in the molecular weight, a mixture of the organic polymer and a catalyst is preferably slowly added dropwise to the hydrosilane compound.

The molar ratio between the terminal unsaturated group of the organic polymer and the hydrosilyl group is not particularly limited, but the molar ratio may be in a range of $2.0 \leq$ hydrosilyl group/terminal unsaturated group of organic polymer. The molar ratio is preferably $3.0 \leq$ hydrosilyl group/terminal unsaturated group of organic polymer from the viewpoint of the introduction of a plurality of epoxy groups and/or oxetane groups in the ends of the organic polymer, and more preferably $3.0 \leq$ hydrosilyl group/terminal unsaturated group of organic polymer $\leq 5.0$ from the viewpoint of suppressing an increase in the molecular weight.

In the present invention, in order to obtain a polymer having a specified terminal structure, a hydrosilane compound represented by formula (8), (9), or (10) can be used.

(8)

wherein $R^1$ and $R^2$ are the same or different and each represent an alkyl group having 1 to 20 carbon atoms, an aryl group having 6 to 20 carbon atoms, an aralkyl group having 7 to 20 carbon atoms, or a triorganosiloxy group represented by (R')$_3$SiO— wherein three R's are each a monovalent hydrocarbon group having 1 to 20 carbon atoms and may be the same or different, and when two or more $R^1$ or $R^2$ are present, they may be the same or different; X represents a monovalent organic group containing an epoxy group and/or an oxetane group; m represents an integer of 0 to 20; and n represents an integer of 1, 2, or 3.

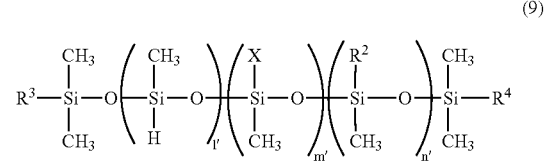

(9)

wherein X represents a monovalent organic group having an epoxy group and/or an oxetane group; $R^2$ represents a hydrocarbon group having 1 to 20 carbon atoms and may contain at least one phenyl group; $R^3$ and $R^4$ each represent hydrogen, a methyl group, or the same as X or $R^2$; l' is 1 on average, and when either $R^3$ or $R^4$ is hydrogen, l' is 0; $1 \leq m'+n' \leq 50$, $1 \leq m'$, and $0 \leq n'$; and the position of each of the units is not specified, and when a plurality of each unit is present, the units may be alternately or randomly positioned.

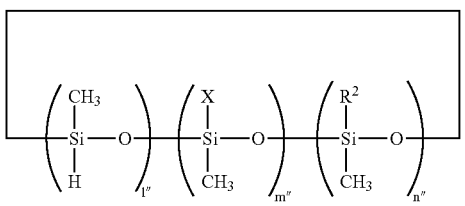

(10)

wherein X and R² are the same as the above; l″ is 1 on average; 1≦m″+n″≦20, 1≦m″, and 0≦n″; and the position of each of the units is not specified, and when a plurality of each unit is present, the units may be alternately or randomly positioned.

In the terminal structure of the organic polymer, X preferably has a structure represented by formula (4) from the viewpoint of reactivity of an epoxy group, and more preferably a structure represented by formula (5) from the viewpoint of easy production and availability of raw materials.

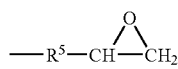

(4)

wherein R⁵ represents a divalent organic group having 1 to 20 carbon atoms and containing at least one selected from the group consisting of hydrogen, oxygen, and nitrogen as a constituent atom.

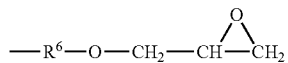

(5)

wherein R⁶ represents a divalent organic group having 1 to 20 carbon atoms and containing at least one selected from the group consisting of hydrogen, oxygen, and nitrogen as a constituent atom. From the viewpoint of curability, the structure is preferably represented by formula (6):

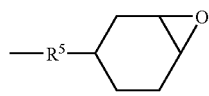

(6)

wherein R⁵ is the same as the above. In formula (9), m′+n′ is 1 to 50, preferably 3 to 30, and particularly preferably 4 to 20 from the viewpoint of compatibility between the polymer and the hydrosilane compound, and reactivity of the photocurable composition containing the resultant organic polymer having an epoxy group and/or an oxetane group.

In addition, m′ is 1 or more, and the reactivity of the organic polymer (A) can be controlled by m′. From the viewpoint of reactivity of the resulting organic polymer having an epoxy group and/or an oxetane group, m′ is preferably 2 or more.

Furthermore, n′ is 0 or more, and compatibility between the hydrosilane compound and the unsaturated group-containing organic polymer can be controlled by n′. In particular, when the main chain skeleton of the organic polymer (A) is a saturated hydrocarbon organic polymer, n′ is preferably 1 or more. When m′ is 2 or more, n′ is also preferably 2 or more. With the main chain skeleton having high polarity, such as an oxyalkylene polymer, n′ is preferably 1.

In formula (10), m″+n″ is 1 to 20 and preferably 3 to 20 from the viewpoint of an increase in the number of epoxy groups at the ends of the polymer and the compatibility between the polymer and the hydrosilane compound.

In addition, m″ is 1 or more, and the reactivity of the organic polymer (A) can be controlled by m″. From the viewpoint of reactivity of the resulting organic polymer having an epoxy group and/or an oxetane group, m″ is preferably 2 or more.

Furthermore, n″ is 0 or more, and compatibility between the hydrosilane compound and the organic polymer can be controlled by n″. In particular, when the main chain skeleton of the organic polymer (A) is a saturated hydrocarbon organic polymer, n″ is preferably 1 or more. With the main chain skeleton having high polarity, such as an oxyalkylene polymer, n″ is preferably 1.

The compatibility between the organic polymer and the hydrosilane compound can be controlled by changing n′ or n″, but another method for controlling the compatibility is to appropriately select the substituent R². For example, when the organic polymer is a saturated hydrocarbon polymer, R² is preferably an alkyl group having 2 to 20 carbon atoms, an aryl group having 6 to 20 carbon atoms, or an aralkyl group having 7 to 20 carbon atoms.

The hydrosilane compound can be synthesized by a known synthesis process. For example, the hydrosilane compound can be obtained by hydrosilylation reaction of a compound terminated with an unsaturated group such as an allyl group or the like with a hydrosilyl group of a polysiloxane compound having a hydrocarbon and a hydrogen atom at a Si atom.

In other words, an epoxy group and/or an oxetane group can be introduced by hydrosilylation of a compound, such as an allyl glycidyl ether, with a polysiloxane compound containing a hydrosilyl group.

Similarly, in the formulae (2) and (3), R² can be introduced by hydrosilylation of a hydrocarbon terminated with an unsaturated group such as an allyl group, α-methylstyrene, or the like.

As a compound represented by formula (10), a method of modifying 1,3,5,7-tetramethylcyclotetrasiloxane as described above to introduce an epoxy group and/or an oxetane group and R² is preferred from the viewpoint of availability of 1,3,5,7-tetramethylcyclotetrasiloxane used as a raw material and selectivity during the introduction.

The organic polymer terminated with an unsaturated group may be synthesized by a generally known method with no problem. For example, when the organic polymer is terminated with a halogen group due to living cationic polymerization or the like, an unsaturated group can be introduced by a method of dehydrohalogenation with a metal alkoxide or reaction with an allyltrimethylsilane in the presence of titanium tetrachloride or the like. As another method, a terminal hydroxyl group of the organic polymer may be reacted with a compound having an unsaturated bond to introduce an unsaturated group by an ether bond, an ester bond, a urethane bond, or a carbonate bond.

For example, a polymer terminated with a hydroxyl group is terminated with an unsaturated group by a method in which a terminal hydroxyl group is converted to an oxymetal group such as —ONa or —OK and then reacted with an unsaturated group-containing compound represented by formula (11):

$$CH_2=CH-R^{12}-Y \quad (11)$$

or formula (12):

$$CH_2=C(R^{13})-R^{12}-Y \quad (12)$$

(wherein $R^{12}$ represents a divalent organic group having 1 to 20, $R^{13}$ represents a hydrocarbon group having 10 or less carbon atoms, and Y represents a halogen atom.)

A method for converting a terminal hydroxyl group to an oxymetal group includes reaction with an alkali metal such as Na or K, a metal hydride such as NaH, a metal alkoxide such as $NaOCH_3$, an alkali hydroxide such as NaOH or KOH, or the like.

Examples of an unsaturated group-containing compound represented by formula (10) or (11) include $CH_2=CH-CH_2-Cl$, $CH_2=CH-CH_2-Br$, $CH_2=CH-C_2H_4-Cl$, $CH_2=CH-C_2H_4-Br$, $CH_2=CH-C_3H_6-Cl$, $CH_2=CH-C_3H_6-Br$, $CH_2=C(CH_3)-CH_2-Cl$, $CH_2=C(CH_3)-CH_2-Br$, $CH_2=C(CH_2CH_3)-CH_2-Cl$, $CH_2=C(CH_2CH_3)-CH_2-Br$, $CH_2=C(CH_2CH(CH_3)_2)-CH_2-Cl$, and $CH_2=C(CH_2CH(CH_3)_2)-CH_2-Br$. In particular, from the viewpoint of reactivity, $CH_2=CH-CH_2-Cl$ and $CH_2=C(CH_3)-CH_2-Cl$ are preferred.

As a further method for introducing an unsaturated group, an isocyanate, a carboxylic acid, or an epoxy compound having $CH_2=CH-CH_2-$, $CH_2=C(CH_3)-CH_2-$, or the like can be used.

The hydrosilylation reaction is preferably effected by a method in which the organic polymer terminated with an unsaturated group is reacted with a hydrosilane compound in the presence of a VIII group transition metal catalyst.

As the VIII group transition metal catalyst, it is effective to use a metal complex catalyst or the like including platinum, rhodium, cobalt, palladium, nickel, or the like selected from the VIII group transition metal elements. Usable examples of the VIII group transition metal catalyst include compounds, such as $H_2PtCl_6\cdot6H_2O$, a platinum-vinylsiloxane complex, a platinum-olefin complex, Pt metal, $RhCl(PPh_3)_3$, $RhCl_3$, $Rh/Al_2O_3$, $RuCl_3$, $IrCl_3$, $FeCl_3$, $PdCl_2\cdot2H_2O$, and $NiCl_2$. In view of reactivity of hydrosilylation, any one of $H_2PtCl_6\cdot6H_2O$, a platinum-vinylsiloxane complex, and a platinum-olefin complex is preferably used. In particular, a platinum-vinylsiloxane complex is preferred from the viewpoint of the short reaction induction period and the like.

Other examples which can be used as the catalyst of the hydrosilylation include $AlCl_3$, and $TiCl_4$, and a radical initiator, such as benzoyl peroxide, or the like, can also be used.

In view of the reaction rate and the like, the preferred temperature of the hydrosilylation may be selected to avoid side reaction such as degradation of the polymer, and the like. However, the temperature is generally in a range of 10° C. to 150° C., preferably 20° C. to 120° C., and more preferably 40° C. to 100° C. If required, a solvent, such as benzene, toluene, xylene, tetrahydrofuran, methylene chloride, pentane, hexane, or heptane, may be used for controlling the reaction temperature, the viscosity of the reaction system, and the like.

The hydrosilylation reaction can be accelerated by a method of reactivating a catalyst using oxygen or adding sulfur, as disclosed in Japanese Unexamined Patent Application Publication No. 8-283339.

Furthermore, in order to suppress oxidation, with oxygen, of the organic polymer, the reaction solvent, the plasticizer or the like present in the system of the hydrosilylation, the hydrosilylation can be performed in the presence of an antioxidant.

The rate of introduction of an epoxy group and/or oxetane group-containing silicon group may be measured by any of various methods. However, under the present conditions, the rate of introduction can be accurately measured by comparison between the integral values of NMR spectra of an end to which an epoxy group and/or oxetane group-containing silicon group is introduced and an end to which such a group is not introduced.

Next, detailed description will be made of the process for producing the saturated hydrocarbon polymer having an epoxy group and/or oxetane group-containing silicon group at an end in the present invention.

In the present invention, an isobutylene polymer having an epoxy group and/or an oxetane group can be produced using a functional terminal type, preferably a fully functional terminal type, isobutylene polymer prepared by a polymerization process referred to as an "inifer process" (cationic polymerization process using a specified compound referred to as an "inifer" serving as a initiator and a chain transfer agent). For example, a polyisobutylene terminated with an unsaturated group is prepared by dehydrohalogenation reaction of the polymer, reaction of unsaturated group introduction to the polymer as disclosed in Japanese Unexamined Patent Application Publication No. 63-105005, or the like, and then subjected to hydrosilylation addition reaction of an epoxy group-containing hydrosilane compound represented by formula (8), (9), or (10) in the presence of a platinum catalyst to introduce an epoxy group-containing silicon group to the polymer.

Similarly, a hydrogenated polybutadiene polymer terminated with an unsaturated group can be produced by a method in which a terminal hydroxyl group of a hydroxyl-terminated hydrogenated polybutadiene polymer is converted to an oxymetal group such as —ONa or —OK, followed by reaction with an unsaturated group-containing compound represented by formula (11) or (12).

In this method, the resultant hydrogenated polybutadiene polymer terminated with an unsaturated group has substantially the same molecular weight as that of the hydroxyl-terminated hydrogenated polybutadiene polymer used as a starting material. However, in order to obtain a polymer having a higher molecular weight, the hydrogenated polybutadiene polymer may be reacted with a polyvalent organic halide having two or more halogens per molecules, such as methylene chloride, bis(chloromethyl)benzene, or bis(chloromethyl)ether, to increase the molecular weight before reaction with an organic halide represented by formula (11) or (12), and then reacted with the organic halide represented by formula (11) or (12), thereby producing a hydrogenated polybutadiene polymer having a higher molecular weight and an olefin group at an end.

In the unsaturated group-terminated hydrogenated polybutadiene polymer, an epoxy group and/or oxetane group-containing silicon group can be introduced by the same addition reaction of the hydrosilane compound in the presence of a platinum catalyst as for the isobutylene polymer.

When the saturated hydrocarbon polymer contains substantially no unsaturated bond other than an aromatic ring in its molecule, the resultant film has higher weather resistance than that of a film formed using a conventional rubber polymer, such as an organic polymer having a unsaturated bond. In addition, the polymer is a hydrocarbon polymer and thus has low gas permeability and high water resistance, and thus a film with low gas permeability can be formed.

In the present invention, a process for producing the oxyalkylene polymer having an epoxy group and/or oxetane group-containing silicon group at an end is not particularly limited. For example, the oxyalkylene polymer can be produced by hydrosilylation reaction between an unsaturated group-terminated oxyalkylene polymer and an epoxy group-containing monohydrosilane compound represented by formula (8), (9), or (10).

As a process for producing the unsaturated group-terminated oxyalkylene polymer, for example, when an unsaturated group is introduced by an ether bond, the same process as described above can be used, in which a terminal hydroxyl group of the oxyalkylene polymer is converted to —OM (M is Na, K, or the like) by metaloxylation, followed by reaction with an unsaturated group-containing compound represented by formula (11) or (12).

A process for producing a vinyl polymer having an epoxy group and/or oxetane group-containing silicon group of the present invention is not particularly limited. For example, such a vinyl polymer can be produced by hydrosilylation reaction of an oxyalkylene polymer terminated with an unsaturated group with an epoxy group-containing monohydrosilane compound represented by formula (8), (9), or (10).

With respect to the introduction of an epoxy group and/or an oxetane group by exchange reaction of a hydrolyzable group, an epoxy group and/or an oxetane group can be introduced by hydrolyzable group exchange reaction between an organic polymer terminated with a hydrolyzable silyl group and a compound having at least one epoxy group and/or oxetane group and one hydroxyl group per molecule.

Typical examples of the hydrolyzable silyl group of the organic polymer terminated with the hydrolyzable silyl group include, but are not limited to, groups represented by formula (13):

$$-[SiR^1{}_2O]_m Si(R^2{}_{3-n})Q_n \qquad (13)$$

(wherein $R^1$, $R^2$, m, and n each represent the same as in formula (1), Q represents a hydroxyl group or a hydrolyzable group, and when at least two Qs are present, they may be the same or different.)

The hydrolyzable group Q is not particularly limited and may be any one of conventionally known hydrolyzable groups. Specific examples of Q include a hydrogen atom, a halogen atom, an alkoxy group, an acyloxy group, a ketoxymate group, an amino group, an amido group, an acid amido group, an aminoxy group, a mercapto group, and an alkenyloxy group. Among these groups, an alkoxy group, such as a methoxy group, an ethoxy group, a propoxy group, an isopropoxy group, or the like is preferred from the viewpoint of mild hydrolyzability and easy handling.

When a reactive silicon group has at least two each of hydroxyl groups and/or hydrolyzable groups, they may be the same or different.

In view of easy availability, a reactive silicon group represented by formula (14) is more preferred:

$$-Si(R^2{}_{3-n})Q_n \qquad (14)$$

(wherein $R^2$, Q, n represent the same as the above.)

A process for producing the organic polymer terminated with the hydrolyzable silyl group is not particularly limited, and such an organic polymer can be produced by the above-described addition reaction between the above-described unsaturated group-terminated organic polymer and a hydrosilane compound represented by formula (15):

$$H-[SiR^1{}_2]_m Si(R^2{}_{3-n})Q_n \qquad (15)$$

(wherein $R^1$, $R^2$, Q, m, and n represent the same as the above.)

As the hydrosilane compound, a compound represented by formula (16) is particularly preferred from the viewpoint of availability.

$$H-Si(R^2{}_{3-n})Q_n \qquad (16)$$

(wherein $R^2$, Q, m, and n represent the same as the above.) Specific examples of the compound represented by formula (15) or (16) include halogenated silanes, such as trichlorosilane, methyldichlorosilane, dimethylchlorosilane, phenyldichlorosilane, trimethylsiloxymethylchlorosilane, and 1,1,3,3-tetramethyl-1-bromodisiloxane; alkoxy silanes, such as trimethoxysilane, triethoxysilane, methyldiethoxysilane, methyldimethoxysilane, phenyldimethoxysilane, trimethylsiloxymethylmethoxysilane, and trimethylsiloxydiethoxysilane; acyloxy silanes, such as methyldiacetoxysilane, phenyldiacetoxysilane, triacetoxysilane, trimethylsiloxymethylacetoxysilane, and trimethylsiloxydiacetoxysilane; ketoxymate silanes, such as bis(dimethylketoxymate)methylsilane, bis(cyclohexylketoxymate)methylsilane, bis(diethylketoxymate)trimethylsiloxysilane, bis(methylethylketoxymate)methylsilane, and tris(acetoxymate)silane; and alkenyloxysilanes, such as methylisopropenyloxysilane. In particular, alkoxysilanes are preferred, and among alkoxy groups, methoxy, ethoxy, propoxy, and isopropoxy are particularly preferred.

The compound to be reacted with the hydrolyzable silyl group-terminated organic polymer, the compound having at least one epoxy group and/or oxetane group and one hydroxyl group per molecule, is not particularly limited, but a compound having a secondary or primary hydroxyl group is preferred from the viewpoint of reactivity.

Specific examples of the compound having at least one epoxy group and/or oxetane group and one hydroxyl group per molecule include compounds represented by formula (17):

$$W'-OH \qquad (17)$$

(wherein W' represents a monovalent organic group containing an epoxy group and/or an oxetane group.)

In view of availability, specific examples of such compounds include compounds, such as 2,3-epoxy-1-propanol, 3-ethyl-3-hydroxymethyloxetane, and glycerin diglycidyl ether.

The amount of such a compound used is not particularly limited, but the compound is preferably used in an amount of 1 equivalent or more relative to the hydrolyzable group of the organic polymer terminated with the hydrolyzable silyl group in order to achieve rapid proceeding of exchange reaction.

The exchange reaction of the hydrolyzable group can be performed by reaction between the organic polymer terminated with the hydrolyzable silyl group and the compound having at least one epoxy group and/or oxetane group and one hydroxyl group per molecule in the presence of an ester exchange reaction catalyst.

The ester exchange reaction catalyst is exemplified by alkali metal alkoxides, Sn compounds, Ti compounds, Zn compounds, Ba compounds, and usual strong alkali compounds. Appropriate examples of the ester exchange reaction catalyst include dimethyltin neodecanoate, dibutyltin diacetate, dibutyltin dilaurate, dioctyltin dilaurate, dibutyltin dioctate, zinc naphthenate, cobalt naphthenate, zinc octylate, tin octylate, cobalt octylate, diisooctyl mercaptoacetate, zirconium naphthenate, zirconium octylate, tetrabutyl titanate, tetraisopropyl titanate, barium hydroxide monohydrate, and other organometallic catalysts. In particular, the ester exchange reaction catalyst is preferably selected from tetrai-

sopropyl titanate, barium hydroxide monohydrate, and alkoxides such as sodium methoxide.

The amount of the ester exchange reaction catalyst used is not particularly limited, but the catalyst is generally used in a range of 50 ppm to 100,000 ppm and preferably 50 ppm to 3,000 ppm relative to the organic polymer.

The reaction may be performed in a solvent. Examples of the solvent include, but are not limited to, aliphatic hydrocarbons, such as pentane, cyclopentane, hexane, cyclohexane, heptane, octane, and nonane; aromatic hydrocarbons, such as benzene, toluene, and xylene; and fluorine, chlorine, or bromine-substituted aliphatic or aromatic hydrocarbons, such as perchloroethylene and bromobenzene. Alternatively, two or more nonpolar solvents may be combined.

The amount of the solvent used is not limited, but the content of the solvent may be 0 to 100 parts by weight relative to 100 parts by weight of the polymer.

In this process, the reaction can be accelerated by removing a volatile component from the product. The volatile component can be removed by a method known in this technical field. In the present invention, any method for removing a volatile component can be used. Examples of such a method include a heating method, a method of heating under reduced pressure, a method using a rotary evaporator, a method using a membrane stripper, a method using a wiped film evaporator, and a combination thereof. The volatile component is preferably removed by heating the product to a temperature of 50° C. to 150° C. under a reduced pressure of about 2,600 to 13,300 Pa.

The organic polymer containing an epoxy group an/or oxetane group-containing silicon group at an end of the present invention is a novel polymer having an epoxy group and/or oxetane group-containing silicon group selectively introduced in an end, and can be synthesized while avoiding degradation of the polymer main chain or the like during the production. The resultant polymer can be cured singly using known reaction of an epoxy group or can be used as a modifier for a conventional epoxy cured product. In either case, it is expected that the characteristics derived from the polymer main chain are exhibited.

The organic polymer containing an epoxy group an/or oxetane group-containing silicon group at an end of the present invention can be cured by a curing method in which an epoxy group and/or an oxetane group is reacted using a general curing agent for epoxy group and/or oxetane group-containing compounds. As the curing agent, an amine curing agent, an acid curing agent, a boron trifluoride amine complex curing agent, a cationic photocuring agent, or the like can be used by a general method.

In particular, when photocuring reaction is used, curing can desirably be completed within a short time.

The cationic photoinitiator (B) of the present invention is not particularly limited, and any initiator which optically initiates cationic polymerization of the resin of the component (A) can be used. A preferred example of the photoinitiator has a structure represented by formula (7):

$$[R^7_a R^8_b R^9_c R^{10}_d W]^{u+} [MZ_{v+u}]^{u-} \quad (7)$$

(wherein W represents S, Se, Te, P, As, Sb, Bi, O, I, Br, Cl, Ti, Zr, Fe, Ru, Os, or N≡N; $R^7$, $R^8$, $R^9$, and $R^{10}$ are the same or different and each represent an organic group; a, b, c, and d each represent an integer of 0 to 3, and (a+b+c+d) equals to the valence of W; M represents a metal or matalloid constituting a center atom of a complex $[MZ_{v+u}]$ and, for example, selected from B, P, As, Sb, Fe, Sn, Bi, Al, Ca, In, Ti, Zn, Sc, V, Cr, Mn, and Co; Z represents a halogen atom, such as F, Cl, or Br, or an organic group which is a ligand coordinating to M; u represents the net electric charge of the complex ion; and v represents the valence of M.)

From the viewpoint of easy availability, the cationic photoinitiator (B) is preferably selected from onium salts, diaryliodonium salts of sulfonic acid, triarylsulfonium salts of sulfonic acid, diaryliodonium salts of boronic acid, and triarylsulfonium salts of boronic acid.

Specific examples of onium salts include diphenyliodonium, 4-methoxydiphenyliodonium, bis(4-methylphenyl)iodonium, bis(4-tert-butylphenyl)iodonium, bis(dodecylphenyl)iodonium, tolylcumyliodonium, triphenylsulfonium, diphenyl-4-thiophenoxyphenylsulfonium, bis[4-(diphenylsulfonyl)-phenyl]sulfide, bis[4-(di(4-(2-hydroxyethyl)phenyl)sulfonio)-phenyl]sulfide, and η5-2,4-(cyclopentadienyl)[1,2,3,4,5,6-η-(methylethyl)benzene]-iron (1+). Specific examples of an anion of formula (7) include tetrafluoroborate, tetrakis(pentafluorophenyl)borate, hexafluorophosphate, hexafluoroantimonate, hexafluoroarsenate, and hexachloroantimonate. These cationic photoinitiators can be used alone or in combination of two or more.

Besides the onium salts, usable examples of the initiators include the initiators described in Japanese Unexamined Patent Application Publication Nos. 11-49791 and 2000-226396, etc, such as decamethylferrocene/tetrakis(3,5-difluorophenyl)borate, decamethylferrocene/tetrakis(3,5-difluoromethylphenyl)borate, and decamethylferrocene/tetrakis[4-(trifluoromethyl)phenyl]borate. These initiators have the effect of improving the stability of a composition, and the like.

The content of the component (B) in the resin composition of the present invention is generally 0.1 to 10 parts by weight and preferably 0.3 to 3 parts by weight. When the content of the component (B) is 0.1 parts by weight or more, the curing conditions of the resin composition are desirably improved. In addition, the content is preferably 10 parts by weight or less from the viewpoint of prevention of elution of the cationic photoinitiator after the curing.

The photocurable composition of the present invention may further contain a sensitizer in addition to the component (B). The sensitizer is not particularly limited, and any sensitizer generally used for cationic photoinitiators can be used with no problem. Specific examples of the sensitizer include, but are not limited to, aromatic hydrocarbons, such as anthracene, pyrene, and perylene, used for sensitizing diaryliodonium and triarylsulfonium salts; aromatic ketones, such as benzophenone, xanthone, thioxanthone, Michler's ketone, and 9,10-phenanthraquinone, eosin, ketocoumarin, and acridine dyes, used for sensitizing diaryliodonium salts; and aromatic amines, aromatic tertiary amines, coumarin, and isobenzofurans, used for sensitizing triarylsulfonium salts.

The photocurable composition of the present invention may contain an epoxy group-containing compound (C) and/or an oxetane group-containing compound (D) according to demand. The epoxy group-containing compound (C) can improve the curability and mechanical strength of a cured product and can be exemplified by the following compounds: Examples of a compound having one epoxy group include phenyl glycidyl ether, butyl glycidyl ether, and the like. Examples of a compound having two or more epoxy groups include hexanediol diglycidyl ether, tetraethylene glycol diglycidyl ether, trimethylolpropane triglycidyl ether, bisphenol A diglycidyl ether, hydrogenated bisphenol A diglycidyl ether, and novolac epoxy compounds. Also, a compound having an alicyclic epoxy group can be used with no problem.

These components (C) may be used alone or in combination of two or more. Since compatibility varies depending on the type of the main chain skeleton of the component (A), a compound suitable for the component (A) is preferably selected as the component (C). The content of the component (C) in the resin composition of the present invention is generally 1 to 70 parts by weight and preferably 1 to 50 parts by weight. The addition of the component (C) is effective in improving the curability, adhesiveness, and heat resistance of the composition.

In the present invention, as the oxetane ring-containing compound (D), any compound having at least one oxetane ring represented by formula (18) can be used.

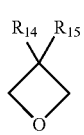

(18)

In this formula, $R^{14}$ and $R^{15}$ are the same or different and each represent a divalent organic group having 1 to 20 carbon atoms and at least one constituent atom selected from the group consisting of hydrogen, oxygen, and nitrogen.

Examples of the oxetane ring-containing compound include 3-ethyl-3-hydroxymethyloxetane, 3-ethyl-3-(phenoxymethyl)oxetane, 3-ethyl-3-hexyloxymethyloxetane, 3-ethyl-3-(2-ethylhexyloxymethyl)oxetane, 3-ethyl-3-{[3-(triethoxysilyl)propoxy]methyl}oxetane, di[1-ethyl(3-oxetanyl)]methyl ether, 1,4-bis{[3-ethyl-(3-oxetanyl)methoxy]methyl}benzene, and 3,3'-dimethyl-2-(p-methoxyphenyl)-oxetane.

These components (D) may be used alone or in combination of two or more. Since compatibility varies depending on the type of the main chain skeleton of the component (A), a compound suitable for the component (A) is preferably selected as the component (D). The content of the component (D) in the resin composition of the present invention is generally 1 to 70 parts by weight and preferably 1 to 50 parts by weight. The addition of the component (D) is effective in increasing the curing rate of the composition and the molecular weight.

The curable composition of the present invention may contain other components, such as another cationically photopolymerizable compound, a silane coupling agent, a filler, a modifier, a stabilizer, another resin component, etc.

Examples of the other cationically photopolymerizable compound include oxolane compounds, cyclic acetal compounds, cyclic lactone compounds, thiirane compounds, thietane compounds, spiroorthoester compounds, vinyl ether compounds, ethylenically unsaturated compounds, cyclic ether compounds, cyclic thioether compounds, vinyl compounds, and the like. These compounds may be used alone or in combination of two or more.

The silane coupling agent is exemplified by silane compounds each having a reactive group such as an epoxy group, a carboxyl group, a methacryloyl group, or an isocyanato group. Specific examples of the silane compounds include trimethoxysilyl benzoate, γ-methacryloxypropyl trimethoxysilane, vinyltriacetoxysilane, vinyltrimethoxysilane, γ-isocyanatopropyl triethoxysilane, γ-glycidoxypropyl trimethoxysilane, and β-(3,4-epoxycyclohexy)ethyl trimethoxysilane. These components may be used alone or in combination of two or more. The content of the silane coupling agent in the resin composition of the present invention is not particularly limited. However, the content is in a range of 0.1 to 20 parts by weight and preferably 0.3 to 10 parts by weight. In the range of 0.1 to 20 parts by weight, a balance between the effect of improving adhesiveness and economics is excellent.

Examples of the filler include silica fine particles, glass beads, talc, styrene polymer particles, methacrylate polymer particles, ethylene polymer particles, and propylene polymer particles. In particular, an inorganic filler can be preferably used, and silica fine particles are particularly preferred. These fillers may be used alone or in combination of two or more.

The silica fine particles preferably include primary particles having an average particle size of 5 to 100 nm. The silica fine particles may be surface-treated or not surface-treated.

By using the inorganic filler, strength, moisture permeability resistance, and adhesiveness can be improved.

Examples of the modifier include a polymerization initiation auxiliary, a leveling agent, a wettability improver, a surfactant, and a plasticizer. These agents may be used alone or in combination of two or more.

Examples of the stabilizer include an age resistor, an antioxidant, a light stabilizer, and an ultraviolet absorber. These agents may be used alone or in combination of two or more.

Examples of the other resin component include resin components, such as polyamides, polyurethanes, polybutadienes, polyethers, polyesters, acrylic resins, silicone resins, and fluororesins.

The curable composition of the present invention is prepared by homogeneously mixing the components. The mixing method is not particularly limited. However, from the viewpoint of stability of the composition, the components are preferably mixed by a method in which first, the components other than the cationic photoinitiator as the component (B) are sufficiently mixed, and then the cationic photoinitiator as the component (B) is mixed. In particular, a component containing a large amount of moisture is preferably mixed after dehydration. The mixing method and mixing apparatus are not particularly limited, but the curable composition is prepared by an appropriately mixing method using manual stirring, a mechanical stirrer, a roll mill, or the like.

A cured product of the present invention is prepared by irradiating the curable composition with a light energy source. The light energy source is not particularly limited, and any light energy source generally used for photocuring reaction can be used. Examples of such an energy source include ultraviolet rays, electrons beams, visible light, and the like. For example, when the curable composition itself is cured, curing is achieved by any known method including passing a substrate on which the curable composition has been applied below a desired light energy source, for example, an ultraviolet lamp, at a predetermined speed; and bringing the necessary light energy source in an output state for a predetermined time to completely expose, to light energy, the substrate on which the composition has been applied.

In preparing the cured product, the curable composition can be applied by any proper method known in this technical field, such as brushing, extrusion, spraying, gravure, kiss-roll coating, or dispenser or air-knife coating.

Examples of the solid substrate on which the photocurable composition of the present invention is applied include flexible sheet materials, such as paper, polyolefin films, polyolefin-coated paper, foils, woods, cardboards, and cotton; metal materials, such as aluminum, copper, stainless steel, and silver; siliceous materials, such as glass and stones; and synthetic polymers, such as polyolefins, polyamides, polyesters, and polyacrylates.

If required, post-curing may be performed by heating or the like after irradiation of light energy, and thereby curing can be more sufficiently performed.

The photocurable composition of the present invention is useful as an adhesive, a paint, a sealing agent composition, a waterproof agent, a spray agent, a blocking material, an injection-type rubber material, and the like. Specifically, the curable composition is useful as a UV curable paint/coating/ink, a liquid solder resist, a liquid crystal resist, an optical fiber coating agent, a UV/visible curable adhesive, an optical disk coating material, a sealant for electronic parts, and the like. In particular, the curable composition is preferably used in electronic part applications which require a reduction in the number of heating steps and improved productivity.

A product including, as a component, the cured product of the photocurable composition of the present invention is produced by applying the photocurable composition of the present invention or a photocurable composition further containing other components according to demand to a portion of each application in which the composition is used, irradiating the portion with light energy to bond or seal the portion, the other components including a cationically photopolymerizable compound, a silane coupling agent, a filler, a modifier, and another resin component.

The process for manufacturing such a product is not particularly limited, and a process suitable for each application can be used. For example, in optical fiber coating, a cup filled with the photocurable composition of the present invention and a UV irradiation device are installed in an optical fiber spinning apparatus, a fiber is drawn and passed through the cup to coat the fiber with the photocurable composition, and then the photocurable composition is cured by UV irradiation to produce an optical fiber coated with a cured product including the curable composition of the present invention.

In use as a sealant for an organic EL element, the periphery of the element on a substrate is sealed and capped with the photocurable composition of the present invention and then sealed with UV irradiation to produce the organic EL element sealed with a cured product including the photocurable composition of the present invention.

In the photocurable composition of the present invention, the type of the main chain skeleton of the component (A) can be changed so that the performance peculiar to the main chain skeleton can be expected.

In particular, when the main chain skeleton of the component (A) includes a saturated hydrocarbon polymer, excellent heat resistance, low moisture permeability, low moisture absorption, low gas permeability, and the like can be imparted to the photocurable composition of the present invention and a cured product containing the composition. The curable composition is suitable as an adhesive or a sealant in the periphery of an electronic material. In particular, the curable composition is suitable as an adhesive or a sealant for parts susceptible to heat, moisture, and the like, for example, organic EL and the like.

When the main chain skeleton of the component (A) includes an oxyalkylene polymer, excellent low-temperature characteristics, flexibility, and compatibility with other components can be imparted to the photocurable composition of the present invention and a cured product containing the composition.

When the main chain skeleton of the component (A) includes an acrylic polymer, by controlling the type of the monomer thereof, excellent weather resistance, flexibility, and compatibility with other components can be imparted to the photocurable composition of the present invention and a cured product containing the composition.

The main chain skeleton of the component (A) may be a single type or combination of two or more types for obtaining the photocurable composition of the present invention, which has all the above-described characteristics, and a cured product containing the composition.

EXAMPLES

The present invention will be further described in detail on the basis of examples. However, the present invention is not limited by these examples.

Synthesis Example 1

(Synthesis of Epoxy Group-containing Hydrosilane)

First, 23.3 g of methylhydrogen polysiloxane having five siloxane repeat units on average and 20 g of toluene were measured and charged in a 200-ml three-necked flask. A condenser and a dropping funnel were mounted on the flask. The mixture was heated to 90° C. Subsequently, a mixture of 7.7 g of α-methylstyrene, 7.44 g of allyl glycidyl ether, 15 g of toluene, and 6 μl of a platinum 1,1,3,3-tetramethyl-1,3-divinyldisiloxane complex (a 0.3 wt % toluene solution in terms of platinum) was slowly added dropwise thereto, and the resulting mixture was stirred for 2 hours. The number of moles of hydrosilane was calculated by the amount of hydrogen generated in adding dropwise an aqueous alkaline solution into methylhydrogen polysiloxane dissolved in an alcohol. The progress of the reaction was traced through decreases in the intensity of $^1$H-NMR peaks (about 5.0 ppm and about 5.3 ppm) attributed to the unsaturated group in α-methylstyrene, $^1$H-NMR peaks (about 5.3 ppm and about 5.9 ppm) attributed to the unsaturated group in allyl glycidyl ether, and a $^1$H-NMR peak (about 4.4 ppm) attributed to hydrosilane. After the completion of the reaction, as a result of confirmation by $^1$H-NMR, hydrosilane (SH-1) was obtained in which on average, two α-methylstyrene groups and two epoxy groups were introduced and one hydrosilyl group remained, as represented by formula (14):

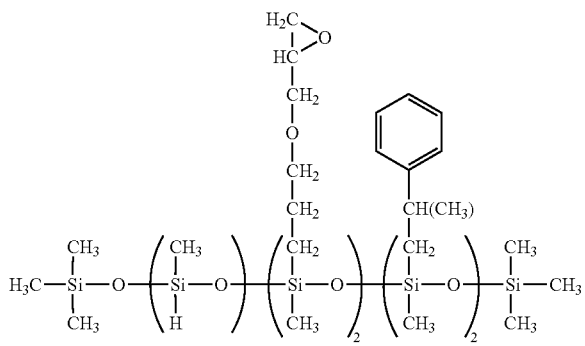

Synthesis Example 2

(Synthesis of Epoxy Group-containing Cyclic Hydrosilane)

First, 100 g of 1,3,5,7-tetramethylcyclotetrasiloxane was measured, charged in a 300-ml three-necked flask, and heated to 90° C. Subsequently, a mixture of 104.5 g of allyl glycidyl ether, 102.6 g of 1-hexadecene, and 10 μl of a platinum-1,1,3,3-tetramethyl-1,3-divinyldisiloxane complex (a 0.3 wt % toluene solution in terms of platinum) was slowly added dropwise to the hydrosilane obtained as described above. After the reaction was performed for 1 hour, peaks (about 5.3 ppm and about 5.9 ppm) attributed to the allyl group were checked by $^1$H-NMR. As a result, it could be confirmed that the allyl group in the reactant disappeared. Thereby, a compound (SH-2) containing 1 hydrosilyl group on average was obtained, as represented by formula (15):

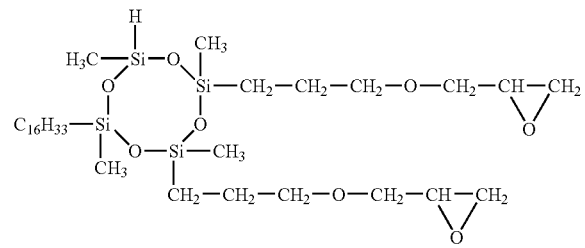

Synthesis Example 3

(Synthesis of Ally-terminated Isobutylene Polymer)

A three-way stopcock was attached to a 2-L glass pressure vessel. After the vessel was purged with nitrogen, 138 ml of ethylcyclohexane (dried by being allowed to stand overnight or more over molecular sieves 3A), 1,012 ml of toluene (dried by being allowed to stand overnight or more over molecular sieves 3A), and 8.14 g (35.2 mmol) of 1,4-bis(α-chloroisopropyl)benzene were added into the vessel with a syringe.

A glass pressure tube for collecting a liquefied gas, the tube being equipped with a needle valve and containing 254 ml (2.99 mol) of an isobutylene monomer, was connected to the three-way stopcock. The polymerization vessel was cooled in a dry ice/ethanol bath at a temperature of −70° C.

Then, the pressure in the vessel was reduced with a vacuum pump. After the needle valve was opened to introduce the isobutylene monomer from the tube for collecting a liquefied gas into the polymerization vessel, the pressure in the vessel was returned to atmospheric pressure by introducing nitrogen into the vessel through one way of the three-way stopcock. Then, 0.387 g (4.15 mmol) of 2-methylpyridine was added thereto, and 4.90 ml (44.7 mmol) of titanium tetrachloride was added to initiate polymerization. After the reaction for 70 minutes, 9.65 g (13.4 mmol) of allyltrimethylsilane was added to perform reaction for introducing an allyl group into a terminal of the polymer. After the reaction for 120 minutes, the reaction solution was washed with 200 ml of water four times. Then, the solvent was removed by distillation to obtain an allyl-terminated isobutylene polymer (P-1).

The yield was calculated from the amount of the resultant polymer, and Mn and Mw/Mn were determined by a GPC method. Also, the terminal structure was determined by 300 MHz $^1$H-NMR analysis in which the intensities of resonance signals of the protons attributed to structures (proton derived from the initiator: 6.5 to 7.5 ppm, and peaks of an allyl group derived from a polymer end (4.97 ppm: =CH$_2$ and 5.79 ppm: —CH=C)) were measured and compared. The $^1$H-NMR measurement was carried out using Varian Gemini 300 (300 MHz for $^1$H) in carbon tetrachloride/deuteroacetone.

GPC was performed using Waters LC Module 1 as a liquid feed system and Shodex K-804 as a column. The molecular weight was determined relative to the polystyrene standard used. The analytical values of the polymer were as follows:

Mn=5800;

Mw/Mn=1.39; and

Fn(v)=1.88 (number of allyl groups per molecule of an aromatic ring used as an initiator residue in NMR analysis).

Synthesis Example 4

(Synthesis of Allyl Group-terminated Oxypropylene Polymer)

Propylene oxide was polymerized using polypropylene glycol having a number-average molecular weight of 2,000 as an initiator in the presence of a zinc hexacyanocobaltate glyme complex catalyst to produce polypropylene glycol having a number-average molecular weight of 10,000. Then, CH$_3$ONa (methanol solution) was added in an amount of 1.2 times equivalent relative to the terminal hydroxyl group of the polypropylene glycol, and the terminal group was converted to a metaloxy group during removal of methanol under reduced pressure. Then, 1.3 times equivalents of 3-chloro-1-propene were added to the reaction mixture, followed by reaction. The salt produced as a by-product was removed by desalting purification to obtain an oxypropylene polymer (P-2) terminated with an allyl group.

As a result of measurement of the content of the terminal allyl group in the resultant polymer, the content was 0.223 mmol/g.

Synthesis Example 5

(Introduction 1 of Epoxy Group-containing Silicon Group in End of Polymer)

First, 100 g of the polyisobutylene polymer (P-1) terminated with an allyl group, 0.05 g of 1,4,-tert-butyl-4-hydroxy-toluene, and 100 g of toluene were weighed and charged in a 500 ml three-necked flask, and a stirrer equipped with a vacuum seal, a condenser, and a ball cock were fitted to the flask.

Next, after heating to 100° C., 11.1 µl of a 1% sulfur toluene solution was added dropwise to the mixture in an atmosphere of air containing 6% oxygen, followed by stirring. Then, 21.6 µl of a toluene solution (3 wt % toluene solution in terms of platinum) of a platinum-1,1,3,3-tetramethyl-1,3-divinyldisiloxane complex was added dropwise to the resultant mixture. The mixture was stirred, and 23.9 g of the hydrosilane compound (SH-2) synthesized as described above was slowly added dropwise to the mixture and subjected to reaction for 2 hours.

The proceeding of the reaction was confirmed by decreases and disappearance of the $^1$H-NMR peaks (5.1 ppm: =CH$_2$ and 5.9 ppm: —CH=C) of a terminal ally group and decreases in the peak (4.8 ppm) of a hydrosilyl group (Si—H) of the epoxy group-containing hydrosilane added dropwise.

$^1$H-NMR measurement of the resultant product showed that the peaks indicating the allyl group and the peak indicating the hydrosilane completely disappeared from the initial allyl group-terminated polymer. As a result, the target isobutylene polymer (A-1) was obtained, the polymer (A-1) containing an epoxy group-containing silicon group having the following terminal structure:

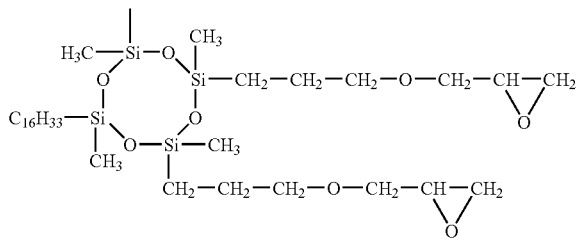

Synthesis Example 6

(Introduction 2 of Epoxy Group-containing Silicon Group in End of Polymer)

First, 100 g of the oxypropylene polymer terminated with an allyl group and 2 g of hexane were weighed and charged in a 300 ml three-necked flask, and a stirrer equipped with a vacuum seal, a three-way stopcock, and a ball cock were fitted to the flask. The resultant mixture was heated to 90° C., stirred, and azeotropically dehydrated for 2 hours using a vacuum pump.

Next, 4.10 μl (3 wt % toluene solution in terms of platinum) of a platinum-1,1,3,3-tetramethyl-1,3-divinyldisiloxane complex was added dropwise to the resultant mixture. The mixture was sufficiently stirred, and 50.5 g of the epoxy group-containing hydrosilane (SH-1) was slowly added to the mixture in a nitrogen atmosphere, followed by stirring for 6 hours.

The proceeding of the reaction was confirmed by decreases and disappearance of the $^1$H-NMR peaks (4.97 ppm: =CH$_2$ and 5.79 ppm: —CH=C) of a terminal ally group and decreases in the peak (near 4.6 ppm) of a hydrosilyl group (Si—H) of the epoxy group-containing monohydrosilane added dropwise.

$^1$H-NMR measurement of the resultant product showed that the peaks indicating the allyl group and the peak indicating the hydrosilane completely disappeared as compared with the initial allyl group-terminated polymer. As a result, the target oxyalkylene polymer (A-2) was obtained, the polymer (A-2) containing an epoxy group-containing silicon group having the following terminal structure:

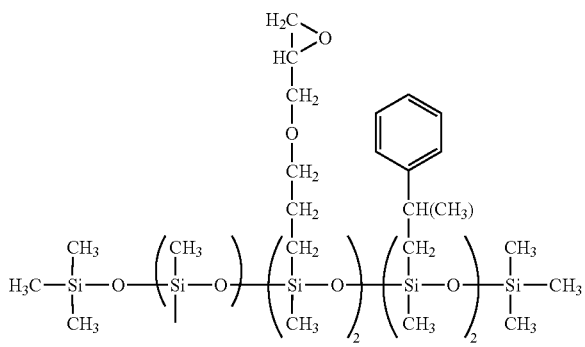

Synthesis Example 7

(Synthesis of Hydrolyzable Silyl Group-containing Polymer)

In a 300 ml three-necked flask, 100 g of the polyisobutylene polymer terminated with an allyl group and 2 g of toluene were weighed, and a stirrer equipped with a vacuum seal, a three-way stopcock, and a ball cock were fitted to the flask. The resultant mixture was heated to 180° C., stirred, and dehydrated and dehydrochlorinated for 2 hours using a vacuum pump.

Next, after cooling to 100° C., 0.05 g of 1,4,-tert-butyl-4-hydoxytoluene, 21.6 μl (3 wt % toluene solution in terms of platinum) of a platinum-1,1,3,3-tetramethyl-1,3-divinyldisiloxane complex, and 11.1 μl of a 1% sulfur toluene solution were added dropwise to the resultant mixture. The resultant mixture was sufficiently stirred.

Furthermore, 5.86 g of methyldimethoxysilane was slowly added dropwise to the mixture through a dropping funnel, followed by stirring in air containing 6% oxygen for 2 hours. Then, excessive methyldimethoxysilane was removed under reduced pressure to obtain an isobutylene polymer terminated with a hydrolyzable group having the following structure:

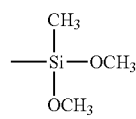

Synthesis Example 8

(Hydrolyzable Group Exchange Reaction)

In a 500 ml flask equipped with a Dean-Stark separator, 100 g of the polyisobutylene polymer terminated with an alkoxysilyl group obtained in Synthesis Example 7 and 100 g of toluene were weighed. Next, 14.4 g of 3-ethyl-3-hydoxymethyloxetane and 200 μl of tetraisopropoxytitanate were added to the resultant mixture, and the mixture was heated to 70° C. under stirring to effect reaction for 16 hours. After the reaction, toluene and excessive 3-ethyl-3-hydoxymethyloxetane were removed under reduced pressure.

The proceeding of the reaction was confirmed by decreases and disappearance of a $^1$H-NMR peak (3.5 ppm: —CH$_3$) of a terminal methoxy group.

$^1$H-NMR measurement of the resultant product showed that on average, 1.5 3-ethyl-3-hydroxymethyloxetane groups were introduced in ends. As a result, the target isobutylene polymer (A-3) was obtained, the polymer (A-3) being terminated with an oxetane group-containing silicon group having the following structure:

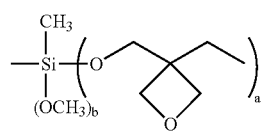

a + b = 2

(Preparation of Photocurable Composition and Cured Product Containing the Composition)

Curable compositions were prepared according to the examples below, and a film was formed by coating each curable composition and irradiated with UV to produce a cured product. Furthermore, each cured product was extracted with a good solvent, and the gel fraction of an insoluble substance was calculated on the basis of measurement values to determine curability.

Evaluation of gel fraction: The resultant cured film was appropriately weighed and wrapped with a 200 mesh wire gauze so that an insoluble material did not flow out. Then, the film was immersed in a sufficient amount of hexane for 15 hours to extract a soluble component, and then dried at 80° C. for 2 hours. The ratio of the insoluble substance to the initial weight was determined as the gel fraction (%).

Light irradiation: The illuminance at a sample position was adjusted to 28,000 to 30,000 μW·cm$^2$ (measurement wavelength: 310 to 400 nm) using a commercial UV lamp (400 W). The irradiation time was adjusted to control the accumulated quantity of light. Under the conditions of the examples, the accumulated quantity of light of 1.5 J was obtained by irradiation for 1 minute. In the examples, the temperature of a sample surface was about 50° C.

Example 1

First, 1 part by weight of triallylsulfonium hexafluoroantimonate cationic photoinitiator (Adekaoptomer SP-172: manufactured by Asahi Denka Kogyo Co., Ltd.) was sufficiently mixed relative to 100 parts by weight of the organic polymer (A-1) synthesized in Synthesis Example 5 to prepare a photocurable composition. The resultant mixture was uniformly deposited to a thickness of 100 μm on a Teflon (R) sheet using an applicator and then irradiated with UV using a UV lamp.

The film cured by UV irradiation with an accumulated quantity of light of 1.5 J was peeled, and a soluble component was extracted with hexane to calculate the gel fraction of an insoluble substance and determine curability (Table 1).

Example 2

First, 10 parts by weight of an oxetane compound (di[1-ethyl(3-oxetanyl)]methyl ether) used as the component (D) was sufficiently mixed relative to 100 parts by weight of the organic polymer (A-1) synthesized in Synthesis Example 5. Furthermore, 1 part by weight of triallylsulfonium hexafluoroantimonate cationic photoinitiator (Adekaoptomer SP-172: manufactured by Asahi Denka Kogyo Co., Ltd.) was sufficiently mixed to prepare a photocurable composition. The resultant mixture was uniformly deposited to a thickness of 100 μm on a Teflon (R) sheet using an applicator and then irradiated with UV using a UV lamp.

The film cured by UV irradiation with an accumulated quantity of light of 1.5 J was peeled, and a soluble component was extracted with hexane to calculate the gel fraction of an insoluble substance and determine curability (Table 1).

Example 3

First, 1 part by weight of triallylsulfonium hexafluorophosphate cationic photoinitiator (Adekaoptomer SP-152: manufactured by Asahi Denka Kogyo Co., Ltd.) was sufficiently mixed relative to 100 parts by weight of the organic polymer (A-2) synthesized in Synthesis Example 6 to prepare a photocurable composition. The resultant mixture was uniformly deposited to a thickness of 100 μm on a Teflon (R) sheet using an applicator and then irradiated with UV using a UV lamp.

The film cured by UV irradiation with an accumulated quantity of light of 1.5 J was peeled, and a soluble component was extracted with hexane to calculate the gel fraction of an insoluble substance and determine curability (Table 1).

Example 4

First, 20 parts by weight of an epoxy compound (1,6-hexanediol diglycidyl ether) used as the component (C) was sufficiently mixed relative to 100 parts by weight of the organic polymer (A-2) synthesized in Synthesis Example 6. Furthermore, 1 part by weight of triallylsulfonium hexafluorophosphate cationic photoinitiator (Adekaoptomer SP-152: manufactured by Asahi Denka Kogyo Co., Ltd.) was sufficiently mixed to prepare a photocurable composition. The resultant mixture was uniformly deposited to a thickness of 100 μm on a Teflon (R) sheet using an applicator and then irradiated with UV using a UV lamp.

The film cured by UV irradiation with an accumulated quantity of light of 1.5 J was peeled, and a soluble component was extracted with hexane to calculate the gel fraction of an insoluble substance and determine curability (Table 1).

Example 5

First, 10 parts by weight of an oxetane compound (di[1-ethyl(3-oxetanyl)]methyl ether) used as the component (D) was sufficiently mixed relative to 100 parts by weight of the organic polymer (A-3) synthesized in Synthesis Example 8. Furthermore, 1 part by weight of triallylsulfonium hexafluoroantimonate cationic photoinitiator (Adekaoptomer SP-172: manufactured by Asahi Denka Kogyo Co., Ltd.) was sufficiently mixed to prepare a photocurable composition. The resultant mixture was uniformly deposited to a thickness of 100 μm on a Teflon (R) sheet using an applicator and then irradiated with UV using a UV lamp.

The film cured by UV irradiation with an accumulated quantity of light of 1.5 J was peeled, and a soluble component was extracted with hexane to calculate the gel fraction of an insoluble substance and determine curability (Table 1).

Example 6

First, 10 parts by weight of an epoxy compound (alicyclic epoxy diluent: Celloxide 3000: manufactured by Daicel Chemical Industries, Ltd.) used as the component (C) and 10 parts by weight of an oxetane compound (di[1-ethyl(3-oxetanyl)]methyl ether) used as the component (D) were sufficiently mixed relative to 100 parts by weight of the organic polymer (A-1) synthesized in Synthesis Example 5. Furthermore, 1 part by weight of triallylsulfonium hexafluoroantimonate cationic photoinitiator (Adekaoptomer SP-172: manufactured by Asahi Denka Kogyo Co., Ltd.) was sufficiently mixed to prepare a photocurable composition. The resultant mixture was uniformly deposited to a thickness of 100 μm on a Teflon (R) sheet using an applicator and then irradiated with UV using a UV lamp.

The film cured by UV irradiation with an accumulated quantity of light of 1.5 J was peeled, and a soluble component was extracted with hexane to calculate the gel fraction of an insoluble substance and determine curability (Table 1).

Comparative Example 1

First, 0.5 parts by weight of dibutyltin diacetylacetonate (Neostan U-220: manufactured by Nitto Kasei Co., Ltd.) was mixed relative to 100 parts by weight of a polyoxypropylene polymer (MS Polymer SAT350: manufactured by Kaneka Corporation) having a hydrolyzable silyl group in its molecule and not having the terminal structure of the present invention. The resultant mixture was uniformly deposited to a thickness of 100 μm on a Teflon (R) sheet using an applicator and then irradiated with UV using a UV lamp. Although confirmation of curability was attempted, a film was not formed because the mixture was not cured.

Confirmation of curability was attempted by UV irradiation curing of a separately prepared sample at the same temperature (about 50° C.) as the sample surfaces in the examples for the same time (in this experiment, 1 minute) as in the examples. However, a film was not formed because the sample was little cured. After allowing to stand at the same temperature for 2 hours, the gel fraction become equivalent to those in the examples (Table 2).

Comparative Example 2

First, 7.3 parts by weight of α-methylstyrene-modified methylhydrogen polysiloxane (CR100 manufactured by Kaneka Corporation) was mixed relative to 100 parts by weight of allyl group-terminated polyisobutylene (EP400A manufactured by Kaneka Corporation) having a molecular weight of about 10,000 and not having the terminal structure of the present invention. The resultant mixture was stirred with the hand, and 90 μL of dimethyl maleate (manufactured by Wako Pure Chemical Industries, Ltd., extra-pure reagent) serving as a preservation improver and 60 μL of a platinum-vinylsiloxane complex catalyst (HS-KA manufactured by Kaneka Corporation) were added to the mixture, followed by manual stirring.

The resultant mixture was uniformly deposited to a thickness of 100 μm on a Teflon (R) sheet using an applicator and then irradiated with UV using a UV lamp. Although confirmation of curability was attempted, a film was not formed because the mixture was not cured.

Confirmation of curability was attempted after heating a separately prepared sample at 100° C. and the same temperature (about 50° C.) as the sample surfaces in the examples for the same time (in this experiment, 1 minute) as the UV irradiation time in the examples. However, the sample was little cured. Furthermore, the gel fraction did not become equivalent to those in the examples even after allowing to stand at 50° C. for 2 hours. However, a gel fraction equivalent to those in the examples was obtained by curing at a hither temperature of 100° C. for 1 hour (Table 2).

Tables 1 and 2 indicate that the composition of any one of the examples has high curability only by UV irradiation within a short time, and the resultant cured products are relatively soft products having rubber elasticity. On the other hand, with the moisture curable or thermal curable compositions of the comparative examples, satisfactory curability could not be achieved within such a short time.

Example 7

A sample was prepared as in Example 1 and then cured by UV irradiation and heating at 80° C. for 1 hour. The resultant cured film was separated, and a soluble component was extracted with hexane to calculate the gel fraction of an insoluble substance and confirm curability. As a result, it was confirmed that the gel faction is improved as compared with curing only by UV irradiation in Example 1 (Table 3).

Example 8

A sample was prepared as in Example 5 and then cured by UV irradiation and heating at 80° C. for 1 hour. The resultant cured film was separated, and a soluble component was extracted with hexane to calculate the gel fraction of an insoluble substance and confirm curability. As a result, it was confirmed that the gel faction was improved as compared with curing only by UV irradiation in Example 5 (Table 3).

These results reveal that the photocurable composition of the present invention has high curability and can produce a cured product having rubber elasticity characteristic of the component (A).

TABLE 1

| | | Example 1 | Example 2 | Example 3 | Example 4 | Example 5 | Example 6 |
|---|---|---|---|---|---|---|---|
| Component (A) | A-1 | 100 | 100 | | | | |
| | A-2 | | | 100 | 100 | | |
| | A-3 | | | | | 100 | 100 |
| Component (B) | Adekaoptomer SP-172*[1] | 1 | 1 | | | 2 | 1 |
| | Adekaoptomer SP-152*[2] | | | 1 | 1 | | |
| Component (C) | 1,6-Hexanediol diglycidyl ether | | | | 20 | | |
| | Celloxide 3000*[3] | | | | | | 10 |
| Component (D) | Di[1-ethyl-(3-oxetanyl)]methyl ether | | 10 | | | 10 | 10 |
| Curability (gel fraction (%)) | UV irradiation 1.5 J | 85 | 90 | 82 | 87 | 85 | 86 |

*[1],*[2]cationic photoinitiator (manufactured by Asahi Denka Kogyo Co., Ltd.)
*[3]Celloxide 3000: alicyclic epoxy diluent (manufactured by Daicel Chemical Industries, Ltd.)

TABLE 2

| | | Comparative Example 1 | Comparative Example 2 |
|---|---|---|---|
| MS Polymer SAT350 | | 100 | |
| EP400A | | | 100 |
| Neostan U220 | | 0.5 | |
| CR100 | | | 7.3 |
| Dimethyl maleate | | | 90 μl |
| Platinum vinyl siloxane | | | 60 μl |
| Curability (gel fraction (%)) | Only UV irradiation | 0 | 0 |
| | 50° C. 1 min | 0 | 0 |
| | 50° C. 2 hr | 92 | 60 |
| | 100° C. 1 hr | — | 93 |

TABLE 3

| | | Example 7 | Example 8 |
|---|---|---|---|
| Component (A) | A-1 | 100 | |
| | A-2 | | |
| | A-3 | | 100 |

TABLE 3-continued

|  |  | Example 7 | Example 8 |
|---|---|---|---|
| Component (B) | Adekaoptomer SP-172*[1] | 1 | 2 |
|  | Adekaoptomer SP-152*[2] |  |  |
| Component (C) | 1,6-Hexanediol diglycidyl ether |  |  |
|  | Celloxide 3000*[3] |  |  |
| Component (D) | Di[1-ethyl-(3-oxetanyl)]methyl ether |  | 10 |
| Curability (gel fraction (%)) | UV irradiation 1.5 J + 80° C. 1 hr | 90 | 89 |

*[1],*[2] cationic photoinitiator (manufactured by Asahi Denka Kogyo Co., Ltd.)
*[3] Celloxide 3000: alicyclic epoxy diluent (manufactured by Daicel Chemical Industries, Ltd.)

INDUSTRIAL APPLICABILITY

A photocurable composition of the present invention is excellent both in photocurability and rubber elasticity after curing.

The invention claimed is:

1. A photocurable composition containing an organic polymer (A) having a structure represented by formula (1), (2), or (3), and a cationic photoinitiator (B):

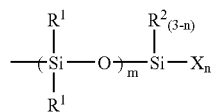
(1)

wherein $R^1$ and $R^2$ are the same or different and each represent an alkyl group having 1 to 20 carbon atoms, an aryl group having 6 to 20 carbon atoms, an aralkyl group having 7 to 20 carbon atoms, or a triorganosiloxy group represented by $(R')_3 SiO$— wherein three R's are each a monovalent hydrocarbon group having 1 to 20 carbon atoms and may be the same or different, and when two or more $R^1$s or $R^2$s are present, they may be the same or different; X represents a monovalent organic group containing an epoxy group and/or an oxetane group; m represents an integer of 0 to 20; and n represents an integer of 1, 2, or 3

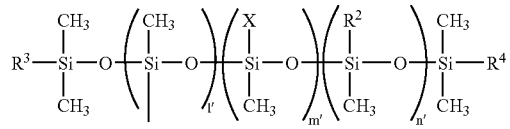
(2)

wherein X and $R^2$ are the same as the above, $R^3$ and $R^4$ each represent a methyl group or the same as X or $R^2$, or either $R^3$ or $R^4$ is a bond part to the organic polymer; l' is 1 on average and represents the number of a bond part to an end of the organic polymer, and when either $R^3$ or $R^4$ is a bond part to the organic polymer, l' is 0; $1 \leq m'+n' \leq 50$, $1 \leq m'$, and $0 \leq n'$; and the position of each of the units is not specified, and when a plurality of each unit is present, the units may be alternately or randomly positioned

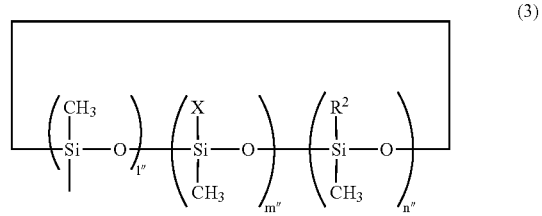
(3)

wherein X and $R^2$ are the same as the above; l" is 1 on average and represents the number of a bond part to an end of the organic polymer; $1 \leq m''+n'' \leq 20$, $1 \leq m''$, and $0 \leq n''$; and the position of each of the units is not specified, and when a plurality of each unit is present, the units may be alternately or randomly positioned and,
wherein the main chain skeleton of the organic polymer (A) is selected from a polyisobutylene and an oxyalkylene polymer.

2. The photocurable composition according to claim 1, wherein X of the organic polymer (A) has a structure represented by formula (4):

(4)

wherein $R^5$ represents a divalent organic group having 1 to 20 carbon atoms and containing at least one selected from the group consisting of hydrogen, oxygen, and nitrogen as a constituent atom.

3. The photocurable composition according to claim 1, wherein X of the organic polymer (A) has a structure represented by formula (5):

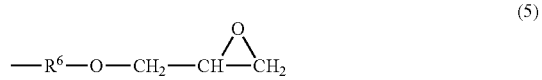
(5)

wherein $R^6$ represents a divalent organic group having 1 to 20 carbon atoms and containing at least one selected from the group consisting of hydrogen, oxygen, and nitrogen as a constituent atom.

4. The photocurable composition according to claim 1, wherein X of the organic polymer (A) has a structure represented by formula (6):

(6)

wherein $R^5$ is the same as the above.

5. The photocurable composition according to claim 1, wherein the organic polymer (A) is produced by reaction between an organic polymer having an unsaturated group at an end and a hydrosilane compound, and the hydrosilane compound contains an epoxy group and/or an oxetane group.

6. The photocurable composition according to claim 1, wherein the organic polymer (A) is produced by hydrolyzable group exchange reaction between an organic polymer having a hydrolyzable silyl group at an end and a compound having one hydroxyl group per molecule, and the compound having one hydroxyl group per molecule contains at least one epoxy group and/or oxetane group.

7. The photocurable composition according to claim 1, wherein the cationic photoinitiator (B) has a structure represented by formula (7):

$$[R^7{}_a R^8{}_b R^9{}_c R^{10}{}_d W]^{u+} [MZ_{v+u}]^{u-} \qquad (7)$$

wherein W represents S, Se, Te, P, As, Sb, Bi, O, I, Br, Cl, Ti, Zr, Fe, Ru, Os, or N≡N; and $R^7$, $R^8$, $R^9$, and $R^{10}$ are the same or different and each represent an organic group; a, b, c, and d each represent an integer of 0 to 3, and (a+b+c+d) equals to the valence of W; M represents a metal or matalloid constituting a center atom of a complex $[MZ_{v+u}]$ and selected from B, P, As, Sb, Fe, Sn, Bi, Al, Ca, In, Ti, Zn, Sc, V, Cr, Mn, and Co; Z represents a halogen atom or an organic group which is a ligand coordinating to M; u represents the net electric charge of the complex ion; and v represents the valence of M.

8. The photocurable composition according to claim 1, wherein the cationic photoinitiator (B) is selected from onium salts, diaryliodonium salts of sulfonic acid, triarylsulfonium salts of sulfonic acid, diaryliodonium salts of boronic acid, and triarylsulfonium salts of boronic acid.

9. The photocurable composition according to claim 1 further containing at least one selected from epoxy group-containing compounds and/or epoxy group-containing oligomers (C) and oxetane group-containing compounds and/or oxetane group-containing oligomers (D).

10. A method for producing a cured product, wherein the photocurable composition according to claim 1 is irradiated with a light energy source to obtain a cured product.

11. A cured product obtained by the method according to claim 10.

12. A product containing the cured product according to claim 11 as a component.

* * * * *